US012567453B2

(12) United States Patent
Kim et al.

(10) Patent No.: US 12,567,453 B2
(45) Date of Patent: Mar. 3, 2026

(54) SEMICONDUCTOR MEMORY DEVICE AND METHOD OF OPERATING THE SAME

(71) Applicant: SAMSUNG ELECTRONICS CO., LTD., Suwon-si (KR)

(72) Inventors: Sangyun Kim, Suwon-si (KR); Younghun Seo, Suwon-si (KR); Kyuchang Kang, Suwon-si (KR); Incheol Nam, Suwon-si (KR); Jaejoon Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 90 days.

(21) Appl. No.: 18/758,738

(22) Filed: Jun. 28, 2024

(65) Prior Publication Data

US 2025/0218492 A1 Jul. 3, 2025

(30) Foreign Application Priority Data

Dec. 28, 2023 (KR) ........................ 10-2023-0195223

(51) Int. Cl.
 *G11C 11/406* (2006.01)
 *G11C 29/18* (2006.01)
(52) U.S. Cl.
 CPC .. *G11C 11/40626* (2013.01); *G11C 11/40622* (2013.01); *G11C 29/18* (2013.01)
(58) Field of Classification Search
 CPC .............................................. G11C 11/40626
 See application file for complete search history.

(56) References Cited

U.S. PATENT DOCUMENTS

| | | | |
|---|---|---|---|
| 6,667,917 | B1 | 12/2003 | Templeton et al. |
| 8,934,311 | B2 | 1/2015 | Yu et al. |
| 9,196,384 | B2 | 11/2015 | Schoenborn et al. |
| 9,281,048 | B2 | 3/2016 | Kim et al. |
| 9,472,269 | B2 | 10/2016 | Arsovski et al. |
| 9,543,044 | B2 | 1/2017 | Jain et al. |
| 2020/0202965 | A1* | 6/2020 | Merritt .................. G06F 3/0659 |

FOREIGN PATENT DOCUMENTS

| | | |
|---|---|---|
| CN | 108305651 A | 7/2018 |
| KR | 10-2122464 B1 | 6/2020 |

* cited by examiner

*Primary Examiner* — Hoai V Ho
(74) *Attorney, Agent, or Firm* — Sughrue Mion, PLLC

(57) ABSTRACT

A method of operating a semiconductor memory device includes: providing NBTI information including row addresses of NBTI vulnerable cells among the plurality of memory cells such that a decrease in a threshold voltage of the cell transistor due to application of the normal turn-off voltage about the NBTI vulnerable cells is greater than a reference decrease value; providing PBTI information including row addresses of PBTI vulnerable cells among the plurality of memory cells such that an increase in the threshold voltage of the cell transistor due to application of the normal turn-on voltage about the PBTI vulnerable cells is greater than a reference increase value; increase the threshold voltage of the NBTI vulnerable cells by performing an NBTI compensation operation based on the NBTI information; and decrease the threshold voltage of the PBTI vulnerable cells by performing a PBTI compensation operation based on the PBTI information.

20 Claims, 32 Drawing Sheets

FIG. 1

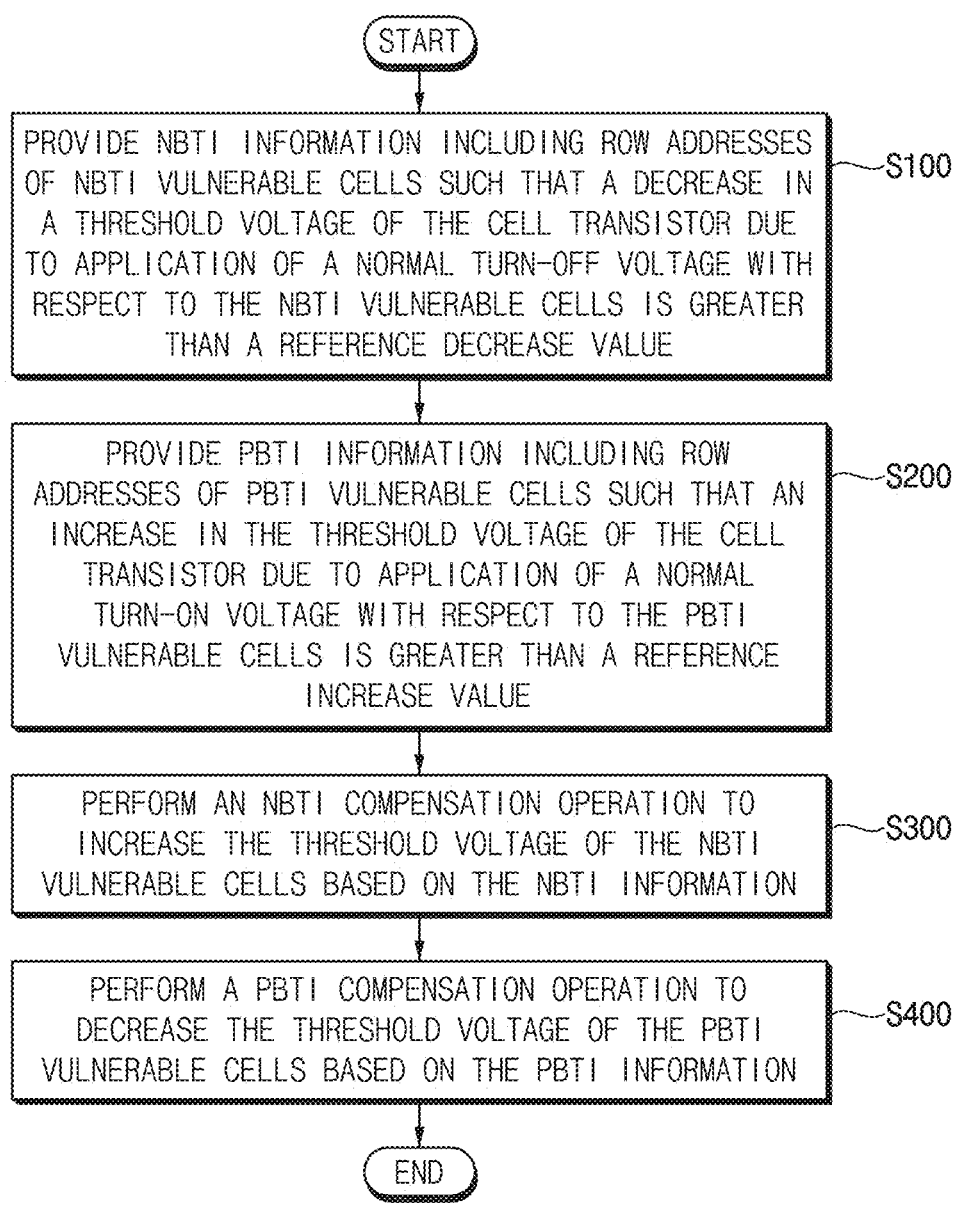

START

PROVIDE NBTI INFORMATION INCLUDING ROW ADDRESSES OF NBTI VULNERABLE CELLS SUCH THAT A DECREASE IN A THRESHOLD VOLTAGE OF THE CELL TRANSISTOR DUE TO APPLICATION OF A NORMAL TURN-OFF VOLTAGE WITH RESPECT TO THE NBTI VULNERABLE CELLS IS GREATER THAN A REFERENCE DECREASE VALUE — S100

PROVIDE PBTI INFORMATION INCLUDING ROW ADDRESSES OF PBTI VULNERABLE CELLS SUCH THAT AN INCREASE IN THE THRESHOLD VOLTAGE OF THE CELL TRANSISTOR DUE TO APPLICATION OF A NORMAL TURN-ON VOLTAGE WITH RESPECT TO THE PBTI VULNERABLE CELLS IS GREATER THAN A REFERENCE INCREASE VALUE — S200

PERFORM AN NBTI COMPENSATION OPERATION TO INCREASE THE THRESHOLD VOLTAGE OF THE NBTI VULNERABLE CELLS BASED ON THE NBTI INFORMATION — S300

PERFORM A PBTI COMPENSATION OPERATION TO DECREASE THE THRESHOLD VOLTAGE OF THE PBTI VULNERABLE CELLS BASED ON THE PBTI INFORMATION — S400

END

FIG. 6

-------------------------------------------------- CVON

———————————————————————————————————— VON

———————————————————————————————————— VOFF

FIG. 8

———————————————————————————— VON

———————————————————————————— VOFF
-------------------------------------------- CVOFF

<u>300</u>

<u>320</u>

| | | | |
|---|---|---|---|
| SU1 → | BREG1 | RREG1 | CREG1 |
| SU2 → | BREG2 | RREG2 | CREG2 |
| SU3 → | BREG3 | RREG3 | CREG3 |
| ⋮ | ⋮ | ⋮ | ⋮ |
| SUk → | BREGk | RREGk | CREGk |

Figure 13A:
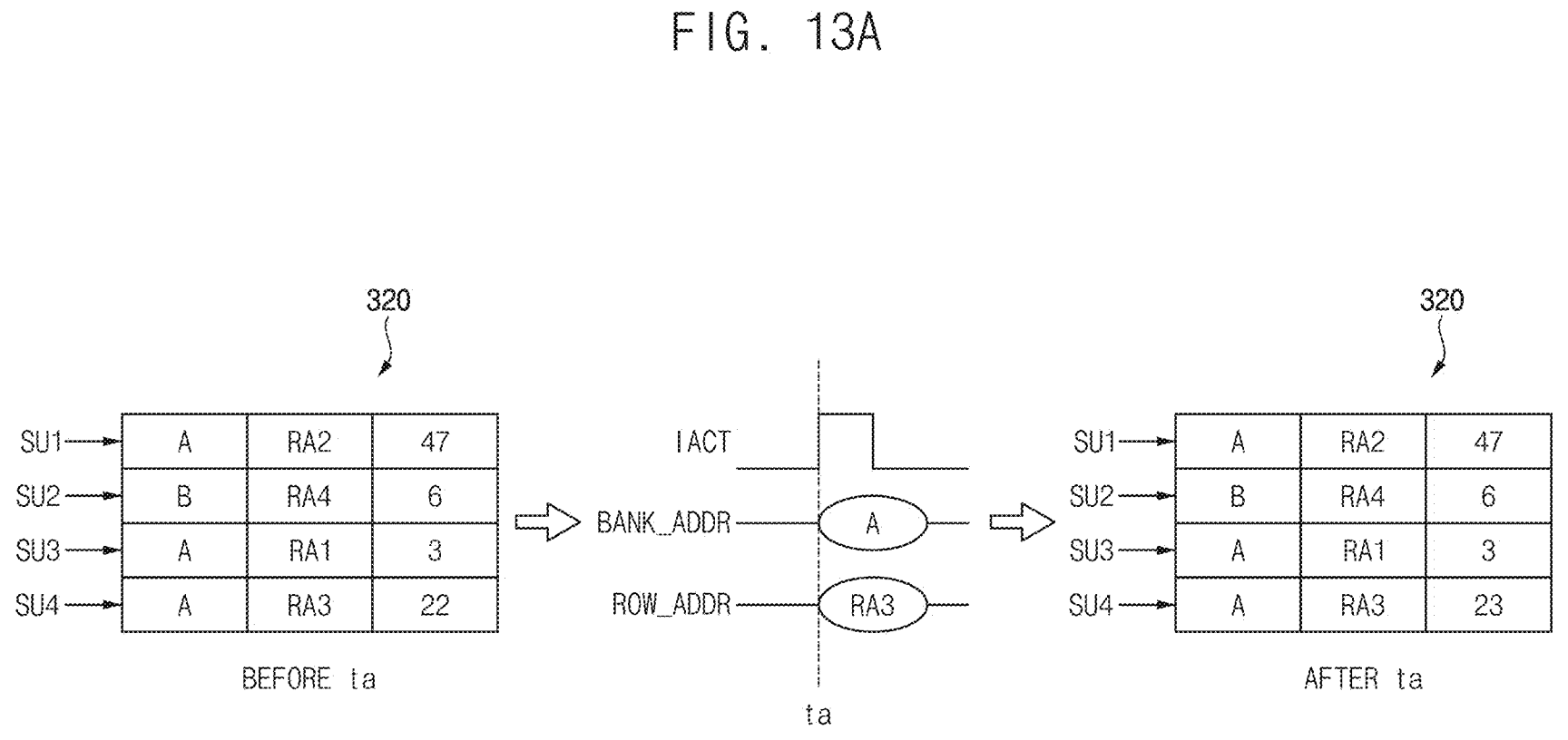

| SU1 → | A | RA2 | 47 |
|---|---|---|---|
| SU2 → | B | RA4 | 6 |
| SU3 → | A | RA1 | 3 |
| SU4 → | A | RA3 | 22 |

BEFORE ta

IACT

BANK_ADDR → ( A )

ROW_ADDR → ( RA3 )

ta

320

| SU1 → | A | RA2 | 47 |
|---|---|---|---|
| SU2 → | B | RA4 | 6 |
| SU3 → | A | RA1 | 3 |
| SU4 → | A | RA3 | 23 |

AFTER ta

Figure 13B:
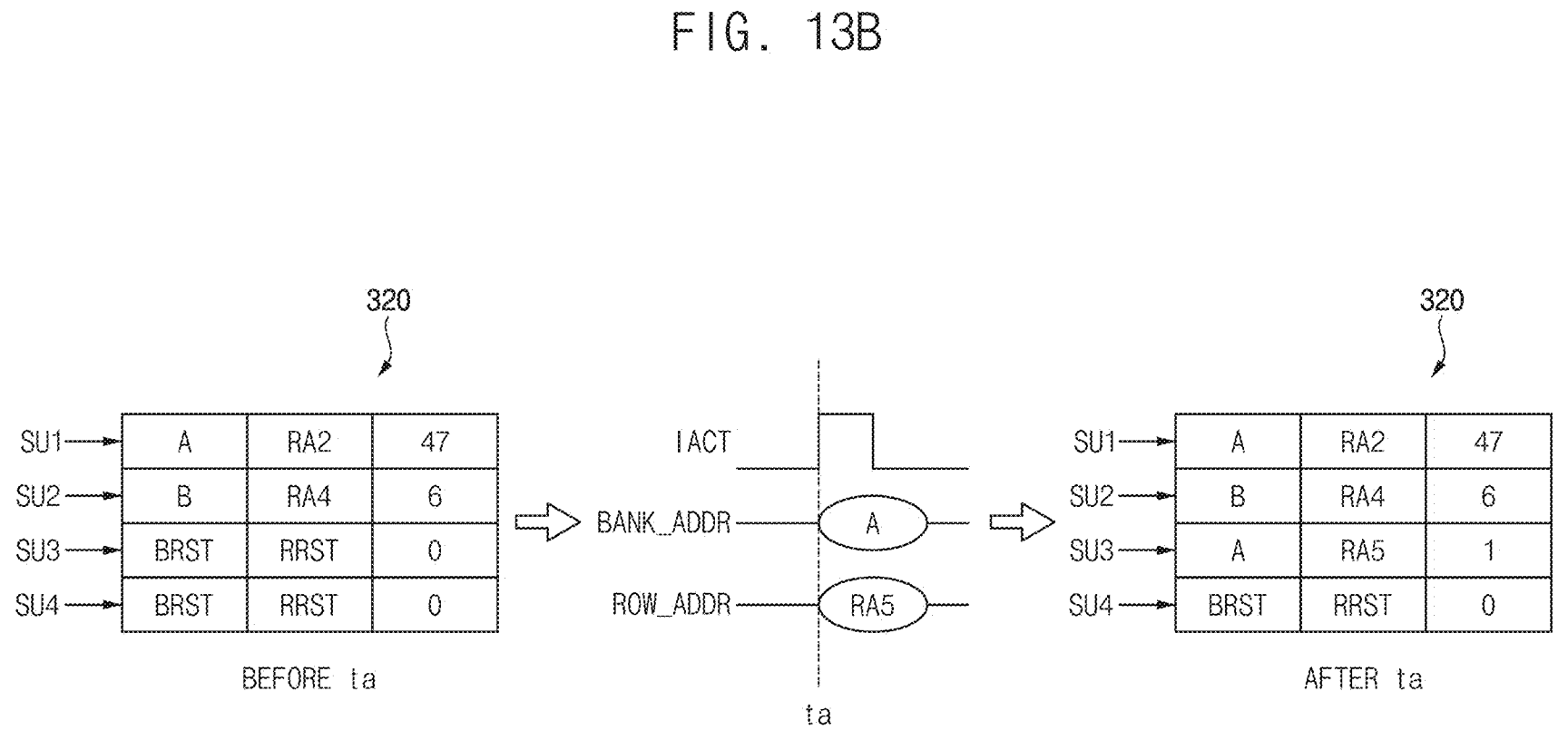

BEFORE ta

| SU1 → | A | RA2 | 47 |
| SU2 → | B | RA4 | 6 |
| SU3 → | BRST | RRST | 0 |
| SU4 → | BRST | RRST | 0 |

IACT

BANK_ADDR — A

ROW_ADDR — RA5 ta

320

AFTER ta

| SU1 → | A | RA2 | 47 |
| SU2 → | B | RA4 | 6 |
| SU3 → | A | RA5 | 1 |
| SU4 → | BRST | RRST | 0 |

Figure 13C:
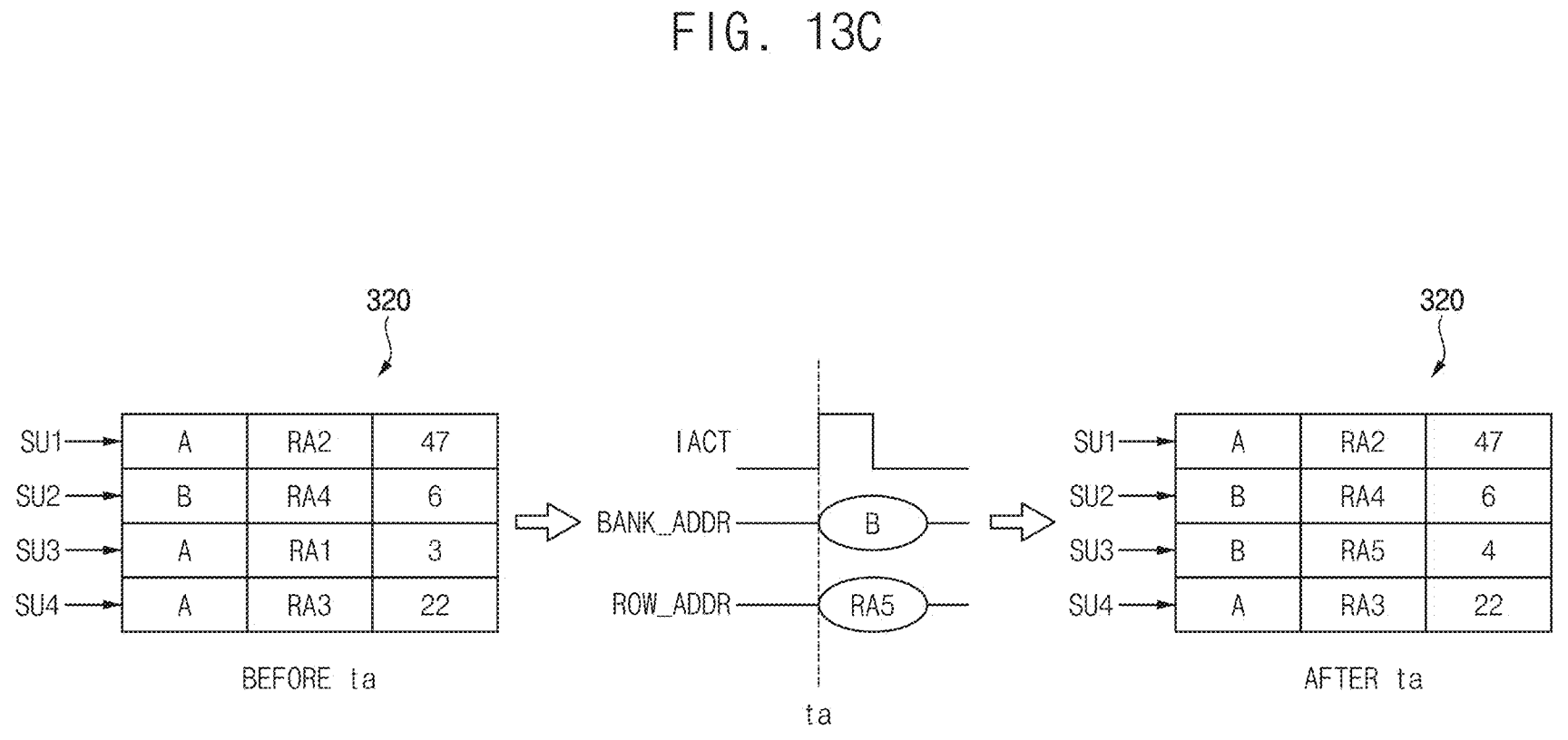

| SU1 → | A | RA2 | 47 |
| SU2 → | B | RA4 | 6 |
| SU3 → | A | RA1 | 3 |
| SU4 → | A | RA3 | 22 |

BEFORE ta

IACT

BANK_ADDR — B

ROW_ADDR — RA5 ta

320

| SU1 → | A | RA2 | 47 |
| SU2 → | B | RA4 | 6 |
| SU3 → | B | RA5 | 4 |
| SU4 → | A | RA3 | 22 |

AFTER ta

F I G. 13D

F I G. 14C

START

APPLY A TEST TURN-OFF VOLTAGE LOWER THAN A NORMAL TURN-OFF VOLTAGE TO A WORDLINE CORRESPONDING TO A TEST ROW ADDRESS ⎯S110

PERFORM A READ OPERATION WITH RESPECT TO THE WORDLINE CORRESPONDING TO THE TEST ROW ADDRESS ⎯S120

DETERMINE WHETHER THE TEST ROW ADDRESS IS A ROW ADDRESS OF NBTI VULNERABLE CELLS BASED ON A RESULT OF THE READ OPERATION ⎯S130

END

FIG. 18

———————————————————————— VON

———————————————————————— VOFF
- - - - - - - - - - - - - - - - - - - - - - - - - - TVOFF

FIG. 20

-------------------------------------------------- TVON

———————————————————————————————— VON

———————————————————————————————— VOFF

SEMICONDUCTOR MEMORY DEVICE AND METHOD OF OPERATING THE SAME

CROSS-REFERENCE TO RELATED APPLICATION

This application is based on and claims priority under 35 U.S.C. § 119 to Korean Patent Application No. 10-2023-0195223, filed on Dec. 28, 2023, in the Korean Intellectual Property Office, the disclosure of which is incorporated by reference herein in its entirety.

BACKGROUND

1. Field

The disclosure relates to semiconductor integrated circuits, and more particularly, to a semiconductor memory device and a method of operating the semiconductor memory device.

2. Description of Related Art

In semiconductor integrated circuits such as semiconductor memory devices, negative bias temperature instability (NBTI) or positive bias temperature instability (PBTI) occurs due to stress caused by external high voltage or high temperature. The threshold voltage of the transistor may vary due to NBTI or PBTI, and thus, the performance of the semiconductor memory device may deteriorate.

For example, in a case of NBTI in a P-channel Metal-Oxide-Semiconductor (PMOS) transistor, when a negative gate voltage is applied and the operation temperature increases due to device driving, the absolute value of the drain current decreases and the absolute value of the threshold voltage and gate induced drain leakage (GIDL) current increase. In particular, if the cell transistor included in the memory cell deteriorates due to NBTI or PBTI, a serious problem may occur in which data stored in the memory cell is lost or distorted.

SUMMARY

Provided are a semiconductor memory device and a method of operating the semiconductor memory device. Provided are a semiconductor memory device and a method that are capable of efficiently compensating for degeneration due to NBTI and PBTI of memory cells.

According to an aspect of the disclosure, a semiconductor memory device includes: a plurality of memory cells, each memory cell including a cell transistor including a gate electrode connected to a wordline corresponding to a row address, wherein the cell transistor is configured to be switched based on a normal turn-on voltage and a normal turn-off voltage that are applied to the wordline during a normal operation; an address manager configured to provide negative bias temperature instability (NBTI) information and positive bias temperature instability (PBTI) information, wherein the NBTI information includes row addresses of NBTI vulnerable cells among the plurality of memory cells such that a decrease in a threshold voltage of the cell transistor due to application of the normal turn-off voltage about the NBTI vulnerable cells is greater than a reference decrease value, wherein the PBTI information includes row addresses of PBTI vulnerable cells among the plurality of memory cells such that an increase in the threshold voltage of the cell transistor due to application of the normal turn-on voltage about the PBTI vulnerable cells is greater than a reference increase value; and a compensation controller configured to: increase the threshold voltage of the NBTI vulnerable cells by performing an NBTI compensation operation based on the NBTI information, and decrease the threshold voltage of the PBTI vulnerable cells by performing a PBTI compensation operation based on the PBTI information.

According to an aspect of the disclosure, a semiconductor memory device includes: a plurality of memory cells, each memory cell including a cell transistor including a gate electrode connected to a wordline corresponding to a row address, wherein the cell transistor is configured to be switched based on a normal turn-on voltage and a normal turn-off voltage applied to the wordline during a normal operation; an address manager configured to provide negative bias temperature instability (NBTI) information and positive bias temperature instability (PBTI) information, wherein the NBTI information includes row addresses of NBTI vulnerable cells among the plurality of memory cells such that a decrease in a threshold voltage of the cell transistor due to application of the normal turn-off voltage about the NBTI vulnerable cells is greater than a reference decrease value, wherein the PBTI information includes row addresses of PBTI vulnerable cells among the plurality of memory cells such that an increase in the threshold voltage of the cell transistor due to application of the normal turn-on voltage about the PBTI vulnerable cells is greater than a reference increase value among the memory cells; and a compensation controller configured to: increase the threshold voltage of the NBTI vulnerable cells by applying a compensation turn-on voltage higher than the normal turn-on voltage to wordlines corresponding to the row addresses of the NBTI vulnerable cells and by performing an NBTI compensation operation based on the NBTI information, and decrease the threshold voltage of the PBTI vulnerable cells by applying a compensation turn-off voltage lower than the normal turn-off voltage to wordlines corresponding to the row addresses of the PBTI vulnerable cells and by performing a PBTI compensation operation based on the PBTI information.

According to an aspect of the disclosure, a method of operating a semiconductor memory device including a plurality of memory cells, each memory cell including a cell transistor including a gate electrode connected to a wordline corresponding to a row address, the cell transistor being configured to be switched based on a normal turn-on voltage and a normal turn-off voltage applied to the wordline during a normal operation, includes: providing negative bias temperature instability (NBTI) information including row addresses of NBTI vulnerable cells among the plurality of memory cells such that a decrease in a threshold voltage of the cell transistor due to application of the normal turn-off voltage about the NBTI vulnerable cells is greater than a reference decrease value; providing positive bias temperature instability (PBTI) information including row addresses of PBTI vulnerable cells among the plurality of memory cells such that an increase in the threshold voltage of the cell transistor due to application of the normal turn-on voltage about the PBTI vulnerable cells is greater than a reference increase value; increase the threshold voltage of the NBTI vulnerable cells by performing an NBTI compensation operation based on the NBTI information; and decrease the threshold voltage of the PBTI vulnerable cells by performing a PBTI compensation operation based on the PBTI information.

The semiconductor memory device and the method of operating the semiconductor memory device according to example embodiments may improve performance and reliability of the semiconductor memory device by efficiently managing the NBTI vulnerable cells and the PBTI vulnerable cells, and by efficiently compensating for variations in the threshold voltage.

BRIEF DESCRIPTION OF THE DRAWINGS

Example embodiments of the disclosure will be more clearly understood from the following detailed description taken in conjunction with the accompanying drawings.

The above and other aspects, features, and advantages of certain embodiments of the disclosure will be more apparent from the following description taken in conjunction with the accompanying drawings, in which:

FIG. 1 is a flowchart illustrating a method of operating a semiconductor memory device according to example embodiments;

FIGS. 5 and 6 are diagrams illustrating an example embodiment of negative bias temperature instability (NBTI) compensation in a method of operating a semiconductor memory device according to example embodiments;

FIGS. 7 and 8 are diagrams illustrating an example embodiment of positive bias temperature instability (PBTI) compensation in a method of operating a semiconductor memory device according to example embodiments;

FIGS. 13A through 13D are diagrams for describing example embodiments of access counting by the address manager of FIG. 9;

FIGS. 14A, 14B, and 14C are timing diagrams illustrating example operations of a refresh controller included in the semiconductor memory device of FIG. 3;

FIGS. 17 and 18 are diagrams illustrating an example embodiment of providing NBTI information in a method of operating a semiconductor memory device according to example embodiments;

FIGS. 19 and 20 are diagrams illustrating an example embodiment of providing PBTI information in a method of operating a semiconductor memory device according to example embodiments;

DETAILED DESCRIPTION

Figure 2:
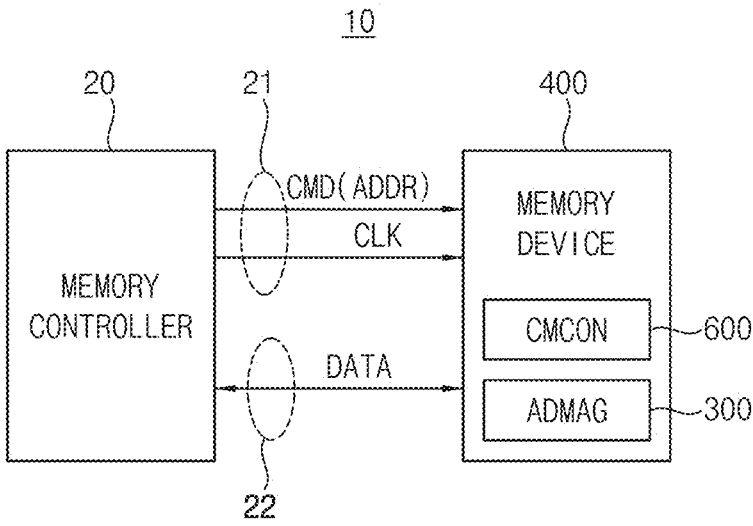
FIG. 2 is a block diagram illustrating a memory system according to example embodiments.

Example embodiments will be described more fully hereinafter with reference to the accompanying drawings, in which some example embodiments are shown. In the drawings, like numerals refer to like elements throughout. The repeated descriptions may be omitted.

The description merely illustrates the principles of the disclosure. Those skilled in the art will be able to devise one or more arrangements that, although not explicitly described herein, embody the principles of the disclosure. Furthermore, all examples recited herein are principally intended expressly to be only for explanatory purposes to help the reader in understanding the principles of the disclosure and the concepts contributed by the inventor to furthering the art and are to be construed as being without limitation to such specifically recited examples and conditions. Moreover, all statements herein reciting principles, aspects, and embodiments of the disclosure, as well as specific examples thereof, are intended to encompass equivalents thereof.

Terms used in the disclosure are used only to describe a specific embodiment, and may not be intended to limit the scope of another embodiment. A singular expression may include a plural expression unless it is clearly meant differently in the context. The terms used herein, comprising a technical or scientific term, may have the same meaning as generally understood by a person having ordinary knowledge in the technical field described in the disclosure. Terms defined in a general dictionary among the terms used in the disclosure may be interpreted with the same or similar meaning as a contextual meaning of related technology, and unless clearly defined in the disclosure, it is not interpreted in an ideal or excessively formal meaning. In some cases, even terms defined in the disclosure cannot be interpreted to exclude embodiments of the disclosure.

In one or more embodiments of the disclosure described below, a hardware approach is described as an example. However, since the one or more embodiments of the disclosure include technology that uses both hardware and software, the various embodiments of the disclosure do not exclude a software-based approach.

In addition, in the disclosure, in order to determine whether a specific condition is satisfied or fulfilled, an expression of more than or less than may be used, but this is only a description for expressing an example, and does not exclude description of more than or equal to or less than or equal to. A condition described as 'more than or equal to' may be replaced with 'more than', a condition described as 'less than or equal to' may be replaced with 'less than', and a condition described as 'more than or equal to and less than' may be replaced with 'more than and less than or equal to'.

The terms "include" and "comprise", and the derivatives thereof refer to inclusion without limitation. The term "or" is an inclusive term meaning "and/or". The phrase "associated with," as well as derivatives thereof, refer to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of A, B, and C" includes any of the following combinations: A, B, C, A and B, A and C, B and C, and A and B and C, and any variations thereof. As an additional example, the expression "at least one of a, b, or c" may indicate only a, only b, only c, both a and b, both a and c, both b and c, all of a, b, and c, or variations thereof. Similarly, the term "set" means one or more. Accordingly, the set of items may be a single item or a collection of two or more items.

A semiconductor memory device according to example embodiments may include a plurality of memory cells and each memory cell may include a cell transistor. The cell transistor includes a gate electrode connected to a wordline corresponding to a row address and the cell transistor may be switched (that is, being turned on and off) based on a normal turn-on voltage and a normal turn-off voltage applied to the wordline in a normal operation. The cell transistors may be implemented as vertical channel transistors including a channel layer formed of indium gallium zinc oxide (IGZO or InxGayZnzO) as will be described below with reference to FIGS. 22, 23, and 24. The IGZO vertical channel transistor may have both negative bias temperature instability (NBTI) and positive bias temperature instability (PBTI), as will be described below with reference to FIG. 25.

FIG. 1 is a flowchart illustrating a method of operating a semiconductor memory device according to example embodiments.

Referring to FIG. 1, NBTI information includes row addresses NBTI vulnerable cells among the plurality of memory cells such that a decrease in threshold voltage of the cell transistor due to application of a normal turn-off voltage with respect to the NBTI vulnerable cells. The NBTI information is greater than a reference decrease value may be provided (S100).

In addition, PBTI information including row addresses of PBTI vulnerable cells among the plurality of memory cells such that an increase in the threshold voltage of the cell transistor due to application of the normal turn-on voltage. The PBTI information is greater than a reference increase value may be provided (S200). Example embodiments of providing NBTI information and PBTI information will be described below with reference to FIGS. 9 through 13D and FIGS. 17 through 21.

Based on the NBTI information, an NBTI compensation operation may be performed to increase the threshold voltage of the NBTI vulnerable cells (S300). In addition, based on the PBTI information, a PBTI compensation operation may be performed to decrease the threshold voltage of the PBTI vulnerable cells (S400). Example embodiments of the NBTI compensation operation and the PBTI compensation operation will be described below with reference to FIGS. 5 through 8.

According to example embodiments, performance and reliability of a semiconductor memory device may be improved by efficiently managing the NBTI vulnerable cells and the PBTI vulnerable cells, and by efficiently compensating for variations in the threshold voltage.

FIG. 2 is a block diagram illustrating a memory system according to example embodiments.

Figure 3:
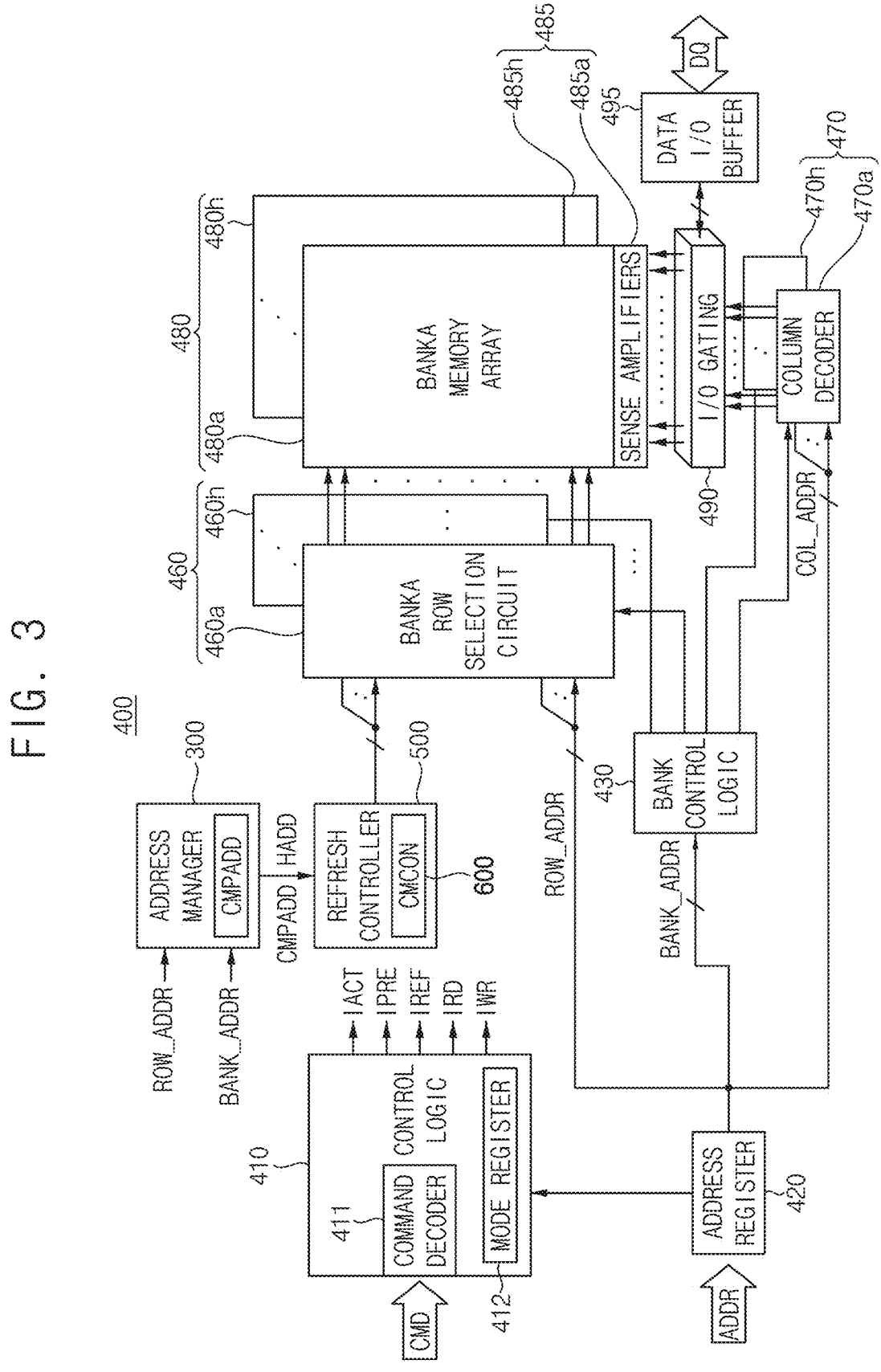
FIG. 3 is a block diagram illustrating a semiconductor memory device according to example embodiments.

FIG. 2 is a block diagram illustrating a memory system according to example embodiments, and FIG. 3 is a block diagram illustrating a semiconductor memory device according to example embodiments.

Referring to FIG. 2, a memory system 10 includes a memory controller 20 and a semiconductor memory device 400. The memory controller 20 and the semiconductor memory device 400 include respective interfaces for mutual communication. The interfaces may be connected through a control bus 21 (for transferring a command CMD, an address ADDR, a clock signal CLK, etc.) and a data bus 22 (for transferring data). According to some standards for the semiconductor memory devices, the address ADDR may be incorporated in the command CMD. The memory controller 20 may generate the command CMD to control the semiconductor memory device 400 and the data may be written to or read from the semiconductor memory device 400 under the control of the memory controller 20.

According to example embodiments, the semiconductor memory device 400 may include an address manager (HM-MAG) 300 and a compensation controller 600. The address manager 300 may store the NBTI information generated by a test operation, and the compensation controller 600 may perform the NBTI compensation operation based on the NBTI information. In addition, the address manager 300 may generate the PBTI information by monitoring access addresses for the normal operation (including a read operation and a write operation) with respect to the plurality of memory cells. The compensation controller 600 may perform the PBTI compensation operation based on the PBTI information.

FIG. 3 is a block diagram illustrating a semiconductor memory device according to example embodiments.

Referring to FIG. 3, a semiconductor memory device 400 may include a control logic 410, an address register 420, a bank control logic 430, a row selection circuit 460 (or row decoder), a column decoder 470, a memory cell array 480, a sense amplifier 485, an input/output (I/O) gating circuit 490, a data input/output (I/O) buffer 495, an address manager 300 and a refresh controller 500. FIG. 3 shows an embodiment in which the compensation controller 600 is included in the refresh controller 500, but example embodiments are not limited thereto. According to example embodiments, the compensation controller 600 may be implemented as a separate logic circuit distinct from the refresh controller 500.

The memory cell array 480 may include a plurality of bank arrays 480a to 480h. The row selection circuit 460 may include a plurality of bank row selection circuits 460a to 460h respectively coupled to the bank arrays 480a to 480h. The column decoder 470 may include a plurality of bank column decoders 470a to 470h respectively coupled to the bank arrays 480a to 480h. The sense amplifier 485 may include a plurality of bank sense amplifiers 485a to 485h respectively coupled to the bank arrays 480a to 480h.

The address register 420 may receive an address ADDR including a bank address BANK_ADDR, a row address ROW_ADDR and a column address COL_ADDR from the memory controller. The address register 420 may provide the received bank address BANK_ADDR to the bank control logic 430, may provide the received row address ROW-_ADDR to the row selection circuit 460, and may provide the received column address COL_ADDR to the column decoder 470.

The bank control logic 430 may generate bank control signals in response to the bank address BANK_ADDR. One of the bank row selection circuits 460a to 460h corresponding to the bank address BANK_ADDR may be activated in response to the bank control signals, and one of the bank column decoders 470a to 470h corresponding to the bank address BANK_ADDR may be activated in response to the bank control signals.

The row address ROW_ADDR from the address register 420 may be applied to the bank row selection circuits 460a to 460h. The activated one of the bank row selection circuits 460a to 460h may decode the row address ROW_ADDR, and may activate a wordline corresponding to the row address ROW_ADDR. For example, the activated bank row selection circuit may apply a wordline driving voltage to the wordline corresponding to the row address ROW_ADDR.

The column decoder 470 may include a column address latch. The column address latch may receive the column address COL_ADDR from the address register 420, and may temporarily store the received column address COL_ADDR. In some embodiments, in a burst mode, the column address latch may generate column addresses that increment from the received column address COL_ADDR. The column address latch may apply the temporarily stored or generated column address to the bank column decoders 470a to 470h.

The activated one of the bank column decoders 470a to 470h may decode the column address COL_ADDR and may control the input/output gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480a to 480h, and write drivers for writing data to the bank arrays 480a to 480h.

Data to be read from one bank array of the bank arrays 480a to 480h may be sensed by one of the bank sense amplifiers 485a to 485h coupled to the one bank array from which the data is to be read, and may be stored in the read data latches. The data stored in the read data latches may be provided to the memory controller via the data I/O buffer 495. Data DQ to be written in one bank array of the bank arrays 480a to 480h may be provided to the data I/O buffer 495 from the memory controller. The write driver may write the data DQ in one bank array of the bank arrays 480a to 480h.

The control logic 410 may control operations of the semiconductor memory device 400. For example, the control logic 410 may generate control signals for the semiconductor memory device 400 in order to perform a write operation, a read operation, or a refresh operation. The control logic 410 may generate internal command signals (such as an active signal IACT, a precharge signal IPRE, a refresh signal IREF, a read signal IRD, a write signal IWR, etc.) based on commands CMD transferred from the memory controller 20 in FIG. 2. The control logic 410 may include a command decoder 411 that decodes the commands CMD received from the memory controller 20 and a mode register 412 that sets an operation mode of the semiconductor memory device 400.

FIG. 3 illustrates the control logic 410 and the address register 420 that are distinct from each other. In some embodiments, the control logic 410 and the address register 420 may be implemented as a single inseparable circuit. In addition, FIG. 3 illustrates the command CMD and the address ADDR are provided as distinct signals. In some embodiments, the command CMD and the address ADDR may be provided as a combined signals as specified by LPDDR5 standards, etc.

The address manager 300 may manage access addresses synthetically with respect to the plurality of bank arrays 480a to 480h based on the bank address BANK_ADDR and the row address ROW_ADDR. The address manager 300 may provide a hammer address HADD and/or row addresses of the NBTI vulnerable cells and the PBTI vulnerable cells among the access addresses for a hammer refresh operation, an NBTI compensation operation and a PBTI compensation operation. The hammer address HADD is an access address that is accessed more intensively than other access addresses. The row addresses of the NBTI vulnerable cells and the PBTI vulnerable cells may be referred to as compensation addresses CMPADD. The refresh controller 500 may generate a hammer refresh address signal based on the hammer address HADD, the hammer refresh address signal represents a row that is physically adjacent to a row corresponding to the hammer address HADD, e.g., a victim row. In addition, the refresh controller 500 may perform the NBTI compensation operation and the PBTI compensation operation based on the hammer addresses HADD and/or the compensation addresses CMPADD.

Figure 4:
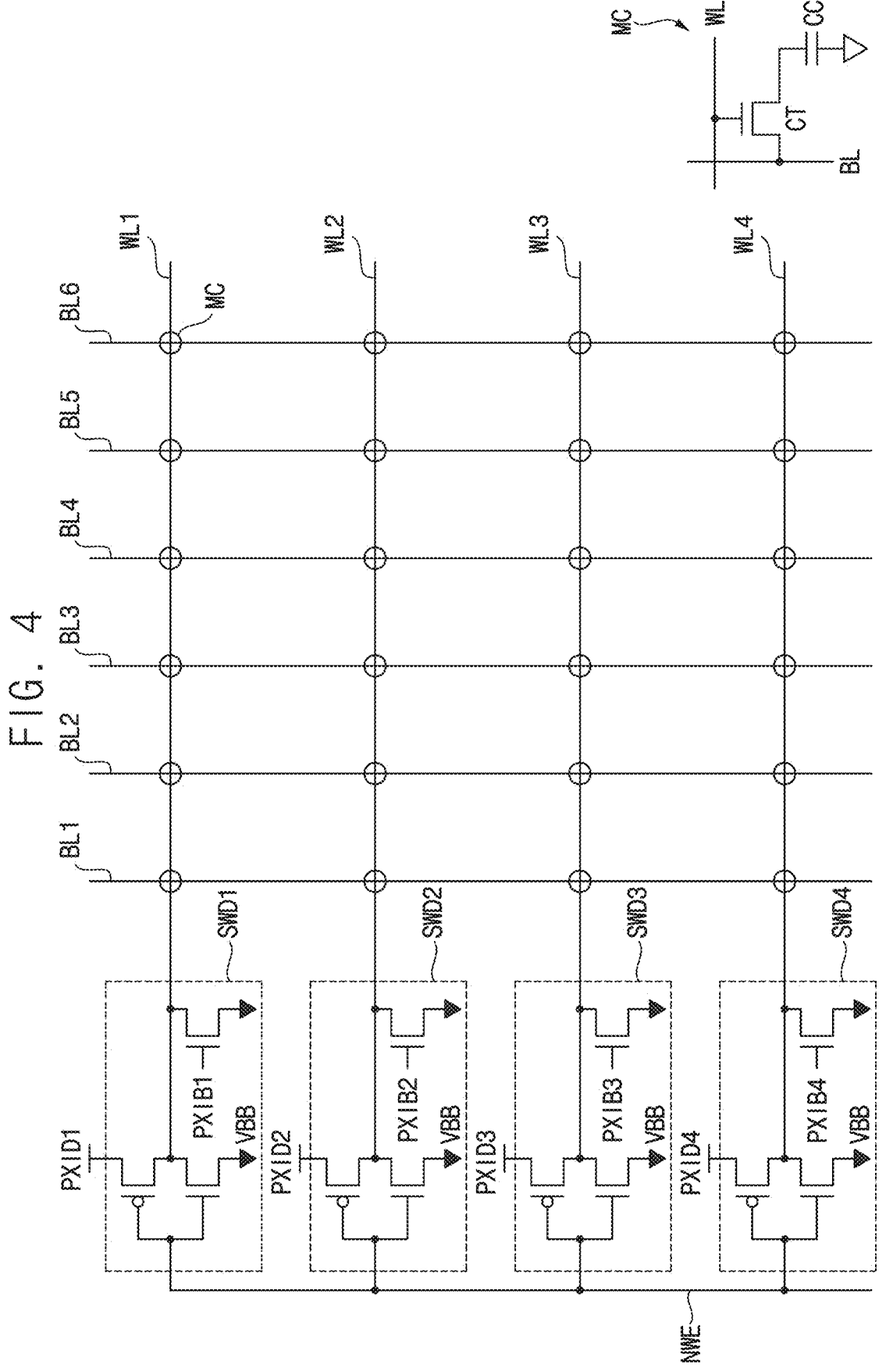
FIG. 4 is a diagram illustrating an example embodiment of a sub wordline driver included in a semiconductor memory device according to example embodiments.

FIG. 4 is a diagram illustrating an example embodiment of a sub wordline driver included in a semiconductor memory device according to example embodiments. FIG. 4 illustrates an example that a plurality of wordlines WL1 to WL4 are connected to one main wordline NWE through sub wordline drivers SWD1 to SWD4.

Signals PXID1 to PXID4 and PXIB1 to PXIB4 are generated by address decoding. The voltage levels of the signals PXID1 to PXID4 correspond to the selected wordline voltage. Signals PXID1 to PXID4 may be generated by the row selection circuit 460 of FIG. 3 described above. The row selection circuit 460 may generate the signals PXID1 to PXID4 by decoding a portion or all of the bits in the row address. During the normal operation, the voltage level of the signal corresponding to the selected wordline among the signals PXID1 to PXID4 signals may have the level of the normal turn-on voltage VON. A sinking voltage VBB of the sub wordline drivers SWD1 to SWD4 may correspond to the normal turn-off voltage VOFF.

Figure 5:
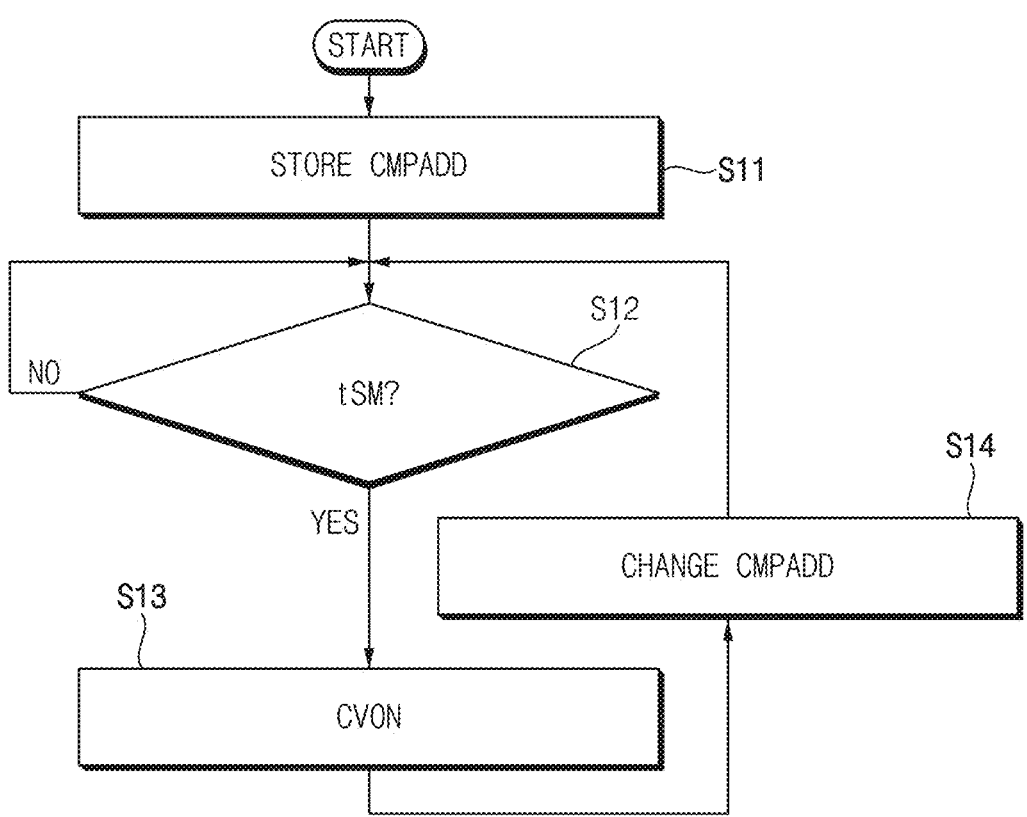
Figure 6:
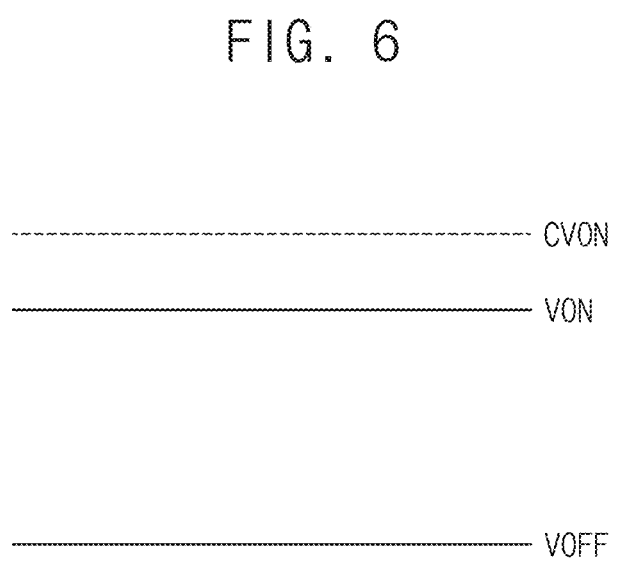

FIGS. 5 and 6 are diagrams illustrating an example embodiment of NBTI compensation in a method of operating a semiconductor memory device according to example embodiments.

Referring to FIGS. 3, 5, and 6, the address manager 300 may store compensation addresses CMPADD corresponding to row addresses of NBTI vulnerable cells (S11). In one embodiment, the compensation addresses CMPADD corresponding to the NBTI vulnerable cells may be generated by a test operation for the semiconductor memory device 400.

As will be described below, the compensation controller 600 may perform the NBTI compensation operation periodically by a compensation period tCM. If the compensation cycle tCM has not elapsed (S12: NO), the compensation controller 600 may remain in a standby state. When the compensation period tCM has elapsed (S12: YES), the compensation controller 600 may perform the NBTI compensation operation by applying a compensation turn-on voltage CVON to the wordline corresponding to one compensation address CMPADD of the NBTI vulnerable cells (S13).

Then, the compensation address CMPADD may be changed to another one of the compensation addresses CMPADD corresponding to the NBTI vulnerable cells (S14) and the same operation may be repeated. By increasing the lowered threshold voltage of the cell transistors of the NBTI vulnerable cells by the NBTI compensation operation, the reliability of the semiconductor memory device may be improved.

Referring to FIG. 6, in the normal operation, the normal turn-on voltage VON may be applied to the selected wordline and the normal turn-off voltage VOFF may be applied to the non-selected wordlines. According to example embodiments, as shown in FIG. 6, in the NBTI compensation operation, the compensation turn-on voltage CVON, which is higher than the normal turn-on voltage VON, may be applied to the wordlines corresponding to the row addresses of NBTI vulnerable cells based on the NBTI information. Further, because the NBTI characteristic degeneration increases as the operation temperature of the semiconductor memory device 400 increases, the compensation turn-on voltage CVON may be increased as the operation temperature of the semiconductor memory device 400 increases.

Figure 7:
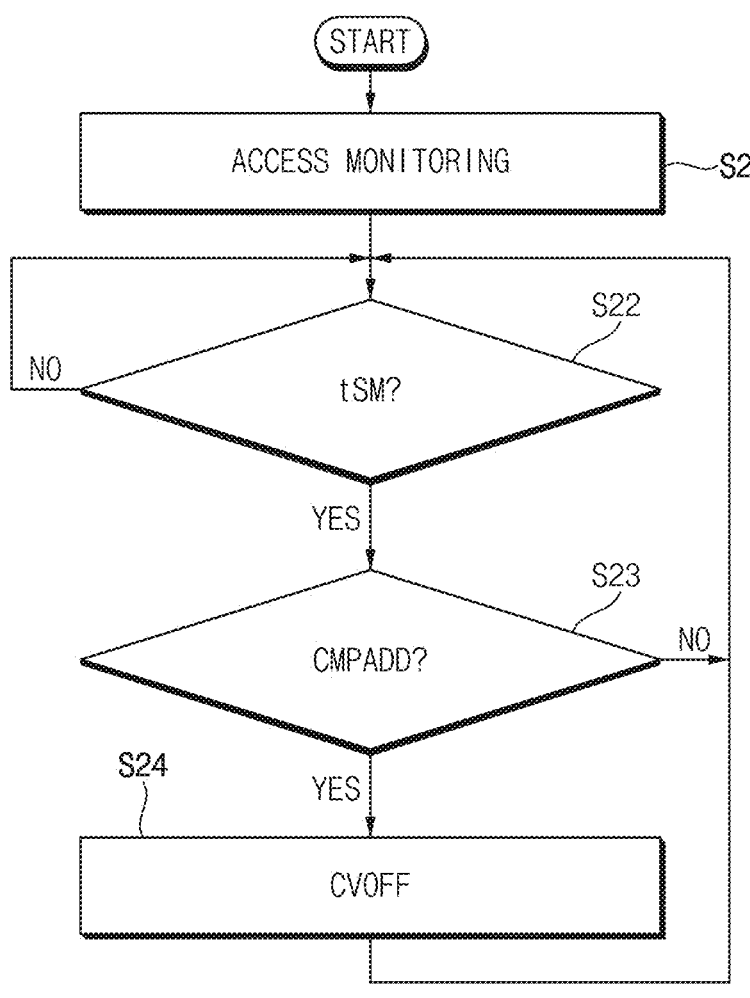
Figure 8:
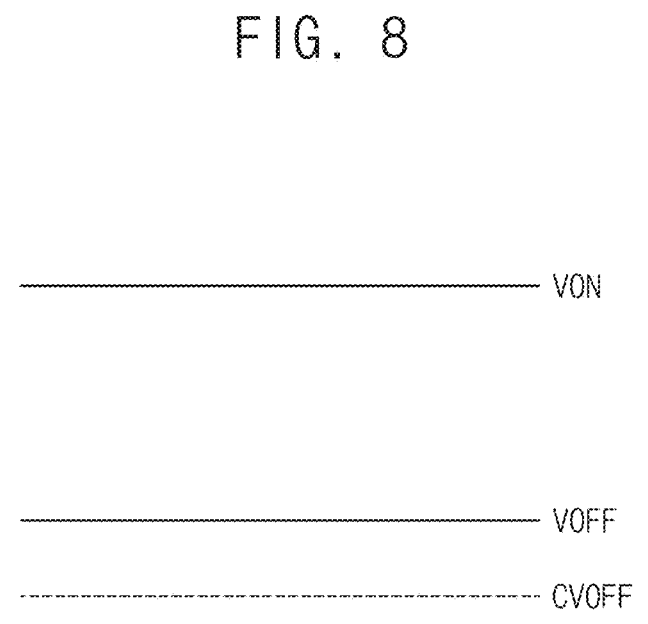

FIGS. 7 and 8 are diagrams illustrating an example embodiment of positive bias temperature instability (PBTI) compensation in a method of operating a semiconductor memory device according to example embodiments.

Referring to FIGS. 3, 7, and 8, the address manager 300 may monitor access addresses for read operations and write operations with respect to the plurality of memory cells during the normal operation to provide the PBTI information including compensation addresses CMPADD corresponding to the row addresses of the PBTI vulnerable cells (S21). In one embodiment, the compensation addresses CMPADD corresponding to the PBTI vulnerable cells may be provided based on the hammer addresses for the hammer refresh operation of the semiconductor memory device 400.

As will be described below, the compensation controller 600 may perform the PBTI compensation operation periodically by a compensation period tCM. If the compensation cycle tCM has not elapsed (S22: NO), the compensation controller 600 may remain in a standby state. If the compensation period tCM has elapsed (S22: YES), the compensation controller 600 may determine whether the compensation address CMPADD corresponding to the PBTI vulnerable cells exist (S23). If the compensation address CMPADD corresponding to the PBTI vulnerable cells are present (S23: YES), the compensation controller 600 may apply a compensation turn-off voltage CVOFF to the wordline corresponding to the one compensation address CMPADD of the PBTI vulnerable cells to perform the PBTI compensation operation (S24). Then, the compensation address CMPADD may be changed to another one of the compensation addresses CMPADD corresponding to the PBTI vulnerable cells and the same operation may be repeated. By reducing the increased threshold voltage of the cell transistors of the PBTI vulnerable cells by the PBTI compensation operation, the reliability of the semiconductor memory device may be improved.

Referring to FIG. 8, during the normal operation, the normal turn-on voltage VON may be applied to the selected wordline and the normal turn-off voltage VOFF may be applied to the unselected wordlines. According to example embodiments, as shown in FIG. 8, during the PBTI compensation operation, the compensation turn-off voltage CVOFF, which is lower than the normal turn-off voltage VOFF, may be applied to the wordlines corresponding to the row addresses of the PBTI vulnerable cells based on the PBTI information. Additionally, as the operation temperature of the semiconductor memory device 400 increases, PBTI characteristic deterioration increases. Therefore, as the operation temperature of the semiconductor memory device 400 increases, the compensation turn-off voltage CVOFF may be further lowered.

Figures 9, 10:
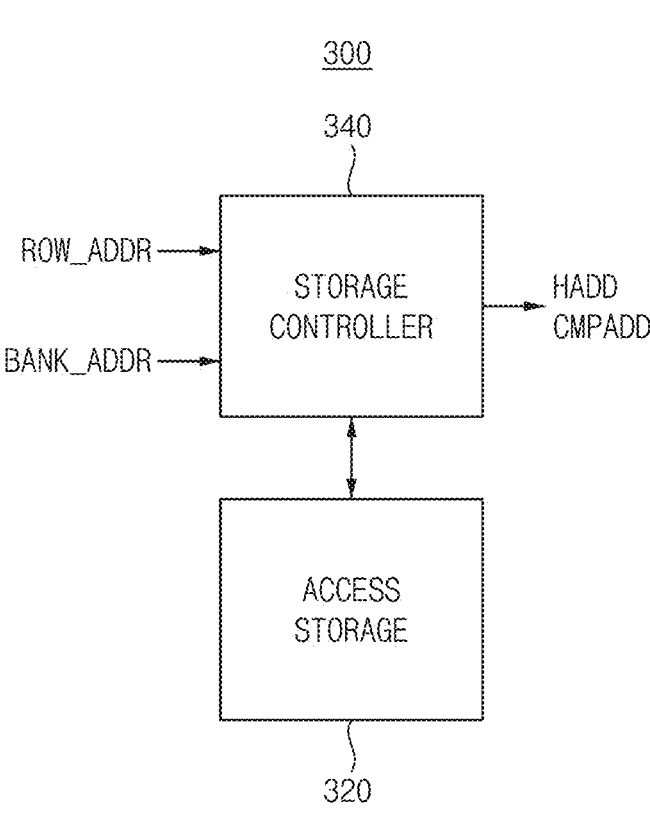
FIG. 9 is a block diagram illustrating an example embodiment of an address manager included in the semiconductor memory device of FIG. 3.
FIG. 10 is a diagram illustrating an example embodiment of an access storage included in the address manager of FIG. 9.

FIG. 9 is a block diagram illustrating an example embodiment of an address manager included in the semiconductor memory device of FIG. 3. FIG. 10 is a diagram illustrating an example embodiment of an access storage included in the address manager of FIG. 9.

Referring to FIG. 9, the address manager 300 may include an access storage 320 and a controller 340. The access storage 320 may store information with respect to the hammer addresses HADD and the compensation addresses CMPADD. In some example embodiments, the access storage 320 may include a plurality of storages SU1 to SUk as illustrated in FIG. 10.

Each storage SUi (i=1 to k) may include a bank register BREGi configured to store the bank address of each access address, a row register RREGi configured to store the row address of each access address and a count register CREGi configured to store each access count value.

The controller 340 may control the access storage 320 based on an access address signal BANK_ADDR and ROW_ADDR that are transferred from the memory controller 20 to the semiconductor memory device 400, as illustrated in FIG. 3. The access address may include the bank address signal BADD_ADDR and the row address signal ROW_ADDR. The controller 340 may determine and provide the hammer address HADD and the compensation address CMPADD among the stored access addresses, based on the access count values. The management scheme of the hammer address HADD and the compensation address CMPADD used by the controller 340 may be determined variously depending on the memory system. According to example embodiments, the compensation addresses CMPADD for the PBTI compensation operation may be the same as the hammer addresses HADD.

Figure 11:
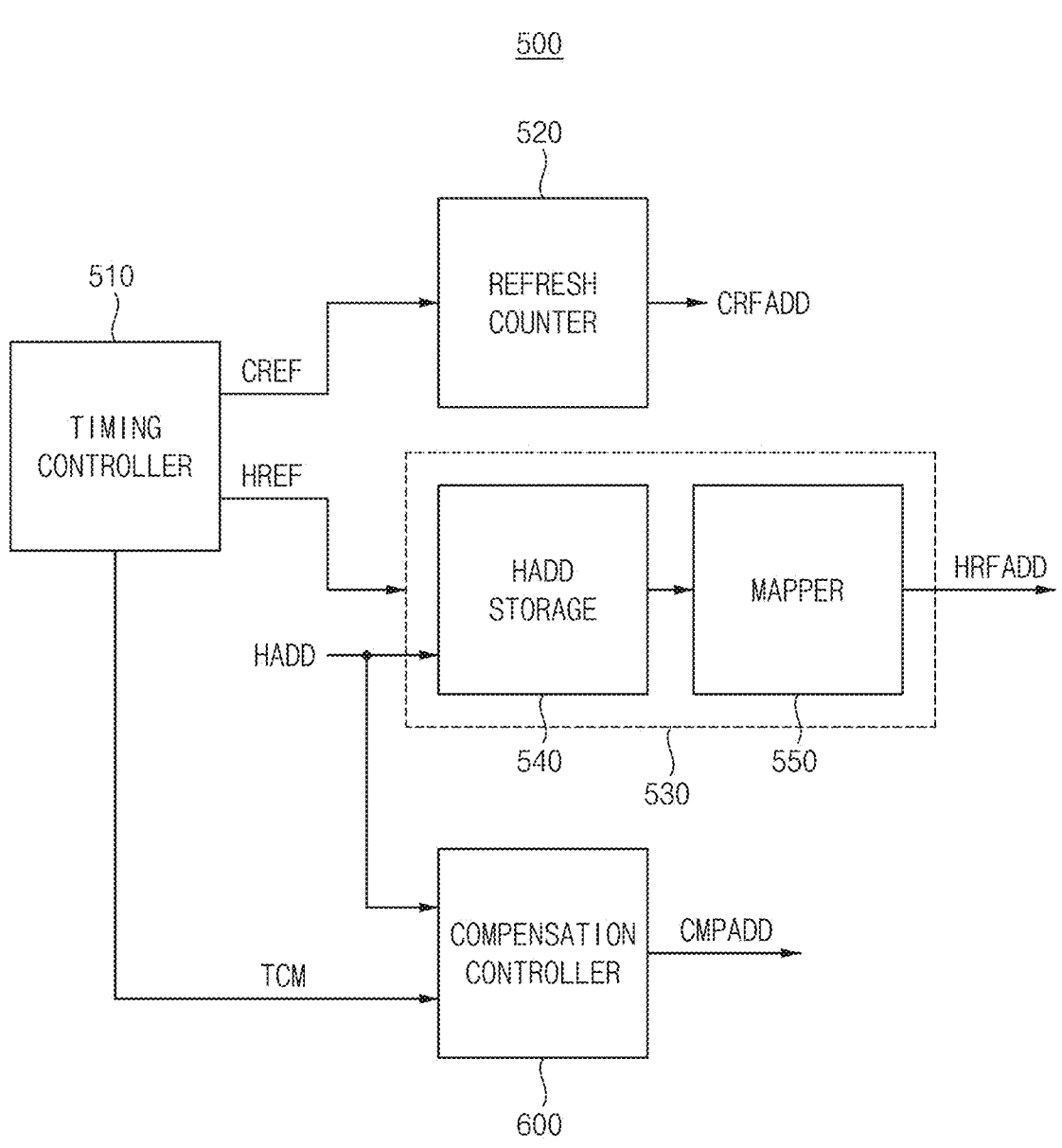
FIG. 11 is a block diagram illustrating an example embodiment of a refresh controller included in the semiconductor memory device of FIG. 3.

FIG. 11 is a block diagram illustrating an example embodiment of a refresh controller included in the semiconductor memory device of FIG. 3. Referring to FIG. 11, a refresh controller 500 may include a timing controller 510, a refresh counter 520, an address generator 530 and a compensation controller 600.

FIG. 11 shows an embodiment in which the compensation controller 600 is included in the refresh controller 500, but example embodiments are not limited thereto. According to example embodiments, the compensation controller 600 may be implemented as a separate logic circuit distinct from the refresh controller 500.

The timing controller 510 generates a counter refresh signal CREF indicating the timing of the normal refresh operation, a hammer refresh signal HREF indicating the timing of the hammer refresh operation, and a compensation signal TCM indicating the timing of the compensation operation. As will be described later with reference to FIGS.

14A, 14B, and 14C, the timing controller 510 may selectively activate the counter refresh signal CREF and the compensation signal TCM.

In one embodiment, as shown in FIG. 11, the timing controller 510 may be included in the refresh controller 500. In other embodiments, the timing controller 510 may be omitted, and the counter refresh signal CREF, the hammer refresh signal HREF and the compensation signal (TCM) may be provided from other control logic within the semiconductor memory device.

The refresh counter 520 generates a counter refresh address signal CRFADD indicating an address that changes sequentially in synchronization with the counter refresh signal CREF. For example, the refresh counter 520 may increase the value of the counter refresh address signal CRFADD by one (1) each time the counter refresh signal CREF is activated. In this way, wordlines for the normal refresh operation may be sequentially selected one by one by increasing the value of the counter refresh address signal CRFADD by one (1).

The address generator 530 stores the hammer address HADD provided from the address manager 300 and generates the hammer refresh address signal HRFADD indicating the row that is physically adjacent to the row corresponding to the hammer address HADD in synchronization with the hammer refresh signal HREF. The address generator 530 may include a hammer address storage 540 and a mapper 550.

The hammer address storage 540 stores the hammer address HADD provided from the address manager 300. The mapper 550 generates the hammer refresh address signal HRFADD based on the hammer address HADD provided from the hammer address storage 540. According to example embodiments, the hammer address storage 540 may be omitted, and, in this case, the mapper 550 may receive the hammer address HADD directly from the address manager 300.

The compensation controller 600 provides the compensation address CMPADD based on the compensation signal TCM indicating the compensation cycle. For example, the compensation controller 600 may sequentially change the compensation address CMPADD whenever the compensation signal TCM is activated. In this way, the wordlines for the NBTI compensation operation or the PBTI compensation operation may be alternatively selected one by one by sequentially changing the compensation address CMPADD.

Figure 12:
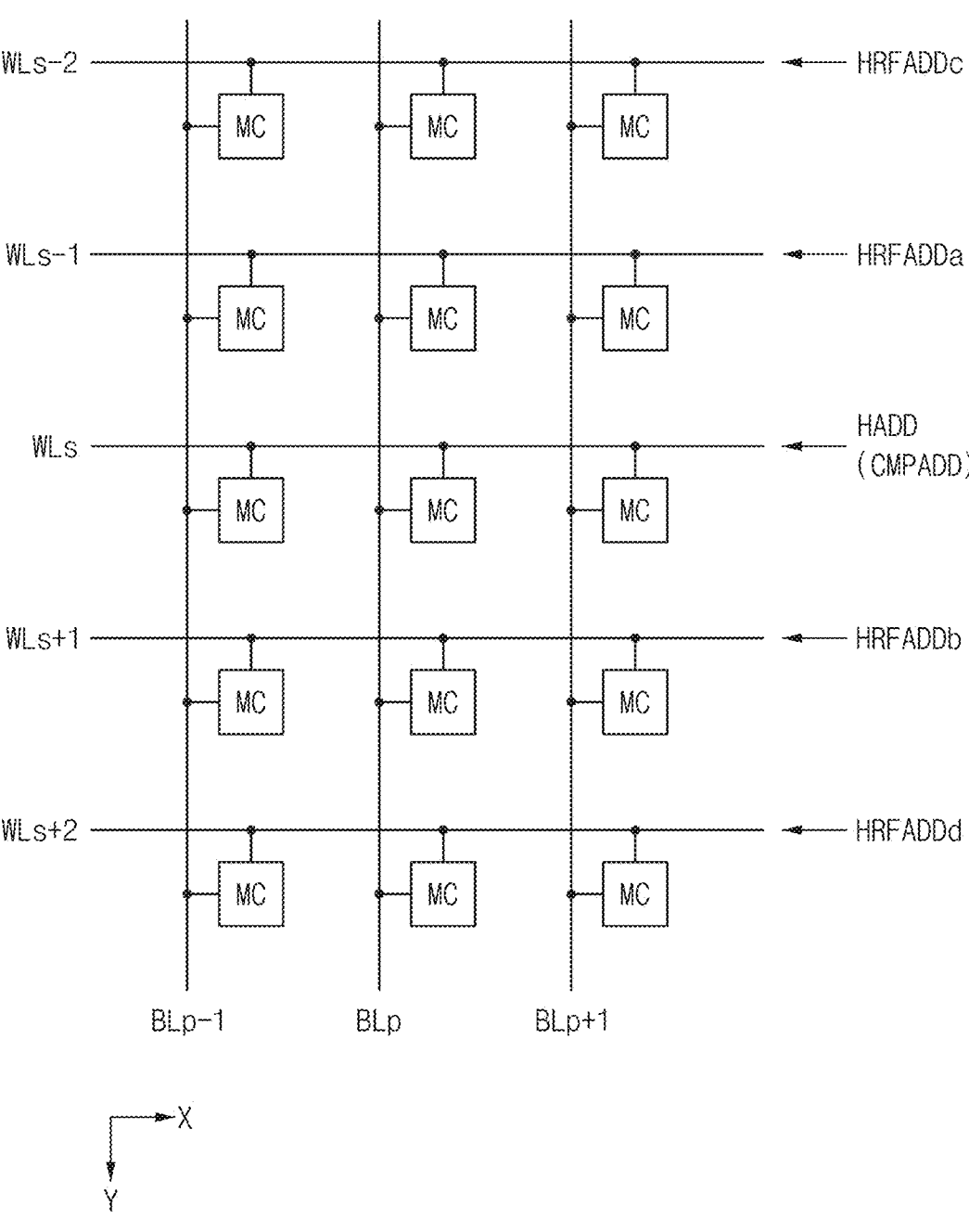
FIG. 12 is a diagram illustrating a portion of a memory cell array for describing a data loss and degeneration of NBTI and PBTI characteristics of wordlines due to wordline coupling.

FIG. 12 is a diagram illustrating a portion of a memory cell array for describing a data loss and degeneration of NBTI and PBTI characteristics of wordlines due to wordline coupling.

FIG. 12 illustrates five wordlines WLs−2, WLs−1, WLs, WLs+1, and WLs+2, three bitlines BLp−1, BLp, and BLp+1 and memory cells MC coupled to the wordlines WLs−2, WLs−1, WLs, WLs+1, and WLs+2 and the bitlines BLp−1, BLp, and BLp+1 in the memory cell array. The five wordlines WLs−2, WLs−1, WLs, WLs+1, and WLs+2 extend in a row direction (e.g., X direction) and are arranged sequentially along a column direction (e.g., Y direction). The three bitlines BLp−1, BLp, and BLp+1 extend in the column direction and are arranged sequentially along the row direction.

For example, the middle wordline WLs may correspond to the hammer address HADD that has been accessed intensively. In some embodiments, an intensively-accessed or hammer wordline refers to a wordline that has a relatively higher activation number and/or has a relatively higher activation frequency (e.g., greater than a predetermined threshold or greater than other access addresses). Whenever the hammer wordline (e.g., the middle wordline WLs) is accessed, the hammer wordline WLs is enabled and precharged, and the voltage level of the hammer wordline WLs is increased and decreased. Wordline coupling may cause the voltage levels of the adjacent wordlines WLs−2, WLs−1, WLs+1, and WLs+2 to fluctuate as the voltage level of the hammer wordline WLs varies. Thus, the cell charges of the memory cells MC coupled to the adjacent wordlines WLs−2, WLs−1, WLs+1, and WLs+2 are affected. As the hammer wordline WLs is accessed more frequently, the cell charges of the memory cells MC coupled to the adjacent wordlines WLs−2, WLs−1, WLs+1, and WLs+2 may be lost more rapidly.

In FIG. 11, the address generator 530 may provide the hammer refresh address signal HRFADD representing addresses HRFADDa, HRFADDb, HRFADDc, and HRFADDd of the rows (e.g., the wordlines WLs−1, WLs+1, WLs−2, and WLs+2) that are physically adjacent to the row of the hammer address HADD (e.g., the middle wordline WLs), and a hammer refresh operation for the adjacent wordlines WLs−1, WLs+1, WLs−2, and WLs+2 may be performed based on (e.g., in response to) the hammer refresh address signal HRFADD to reduce or possibly prevent the loss of data stored in the memory cells MC. The hammer refresh operation may be performed with respect to the two wordlines WLs−1 and WLs+1 directly adjacent to the hammer wordline WLs or with respect to the four wordlines WLs−2, WLs−1, WLs+1 and WLs+2 including the next adjacent wordlines WLs−2 and WLs+2.

In FIG. 11, additionally, the compensation controller may provide the hammer address HADD as the compensation address CMPADD for the PBTI compensation operation. The reliability of the semiconductor memory device may be improved by reducing the increased threshold voltage of cell transistors of the PBTI vulnerable cells connected to the row WLs corresponding to the compensation address CMPADD by the PBTI compensation operation.

FIGS. 13A through 13D are diagrams for describing example embodiments of access counting by the address manager of FIG. 9. Hereinafter, example embodiments of managing the access addresses for the PBTI compensation operation (and/or the hammer refresh operation) and providing the compensation address are described with reference to FIGS. 13A through 13D.

FIGS. 8D through 13D are provided as an example or examples for describing the synthetic management of the access addresses with respect to a plurality of memory banks, and the specific operation scenario may be implemented variously.

Even though FIGS. 13A through 13D illustrate an example that the access storage 320 includes four storages SU1, SU2, SU3, and SU4 for convenience of illustration and description, the number of the storages may be changed variously. FIGS. 13A through 13D illustrate a bank address of a bank address signal BANK_ADDR, a row address of a row address signal ROW_ADDR, and an access count value at an activation time point ta of an active signal IACT indicating a reception time of an active command provided from a memory controller, and the states of the access storage 320 before and after the activation time point ta of the active signal IACT.

Referring to FIGS. 9 and 13A, when an input access address (A and RA3), which is a combination of a bank address A and a row address RA3 provided through the address signals BANK_ADDR and ROW_ADDR, corresponds to one of access addresses (A, RA2), (B, RA4), (A, RA1), and (A, RA3) stored in the access storage 320, the controller 340 may increase an access count value corresponding to the input access address (A, RA3) by one from 22 to 23. As such, the address manager 300 may accumulate the access count values.

Referring to FIGS. 9 and 13B, when an input access address (A and RA5), which is provided through the address signals BANK_ADDR and ROW_ADDR, does not correspond to one of access addresses (A, RA2) and (B, RA4) stored in the access storage 320 and some storages (e.g., SU3 and SU4) have been initialized to a reset bank address BRST and a reset row address RRST, the controller 340 may store the input access address (A, RA5) and corresponding access count value in one storage value (e.g., SU3) that has been initialized. For example, the reset addresses BRST and RRST may correspond to a predetermined value such as "0000", "1111", etc. When the reset addresses BRST and RRST are stored in the storage, the storage may be regarded as an unoccupied space in which a valid address is not stored.

Figure 13D:
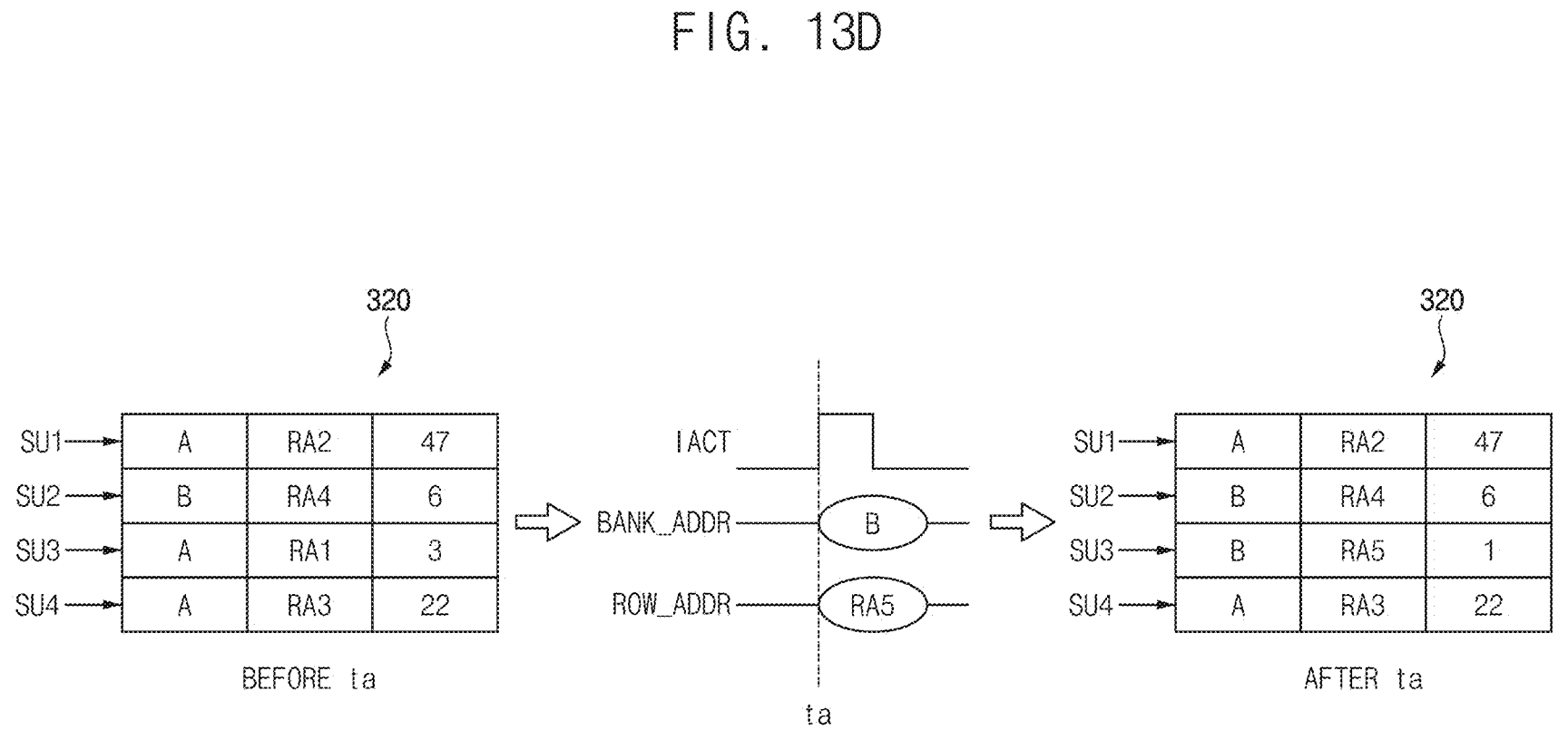

Referring to FIGS. 9, 13C and 13D, when a new input access address (B, RA5) is accessed while all of the storages SU1, SU2, SU3 and SU4 are occupied by the access addressed, the storage controller in the address manager 300 may store the new input access address (B, RA5) by replacing the stored access address (A, RA1) corresponding to a minimum access count value "3" among the access count values "47, 6, 3 and 22". Throughout the disclosure, "a minimum access count value" refers to a lowest access count value among the access count values stored in the access storage 320. In some example embodiments, as illustrated in FIG. 13C, the access count value "3" corresponding to the replaced access address (A, RA1) may be maintained and the access count value of the new access address (B, RA5) may be stored as "4". In some embodiments, as illustrated in FIG. 13D, the access count value "3" corresponding to the replaced access address (A, RA1) may be initialized to "0" and the access count value of the new access address (B, RA5) may be stored as "1".

Figure 14A:
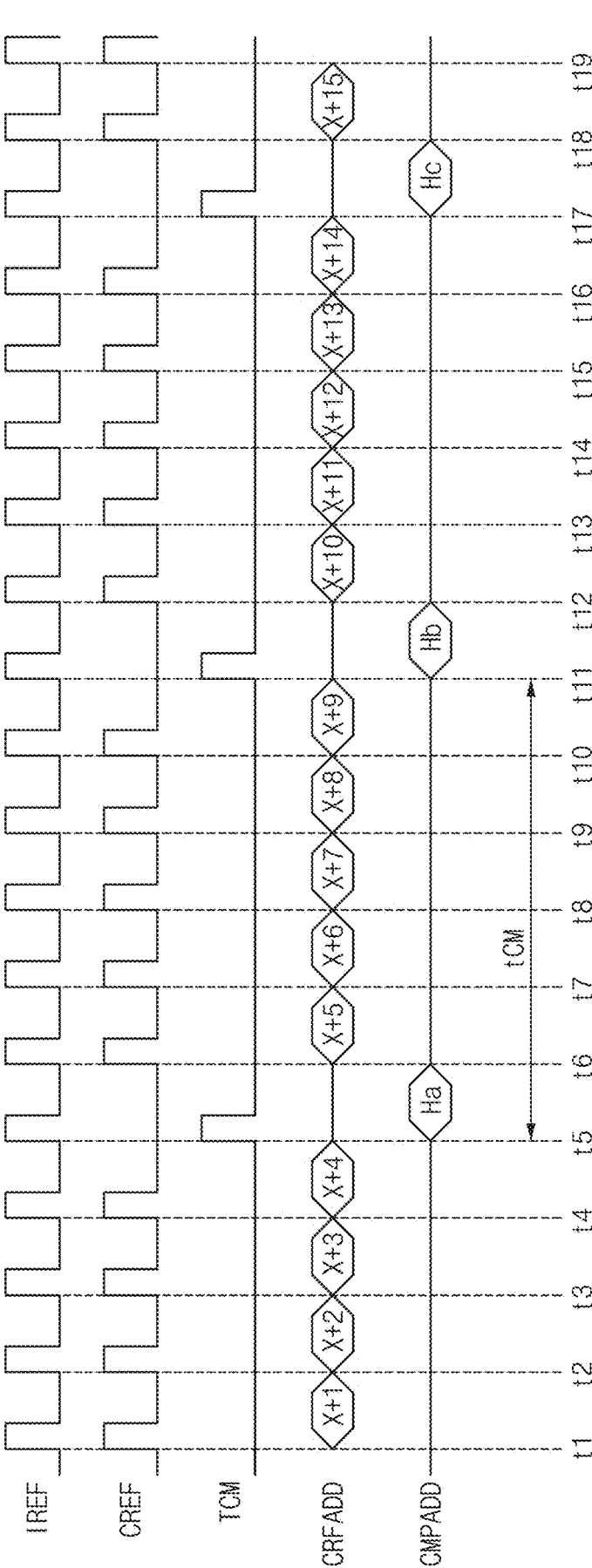
Figure 14B:
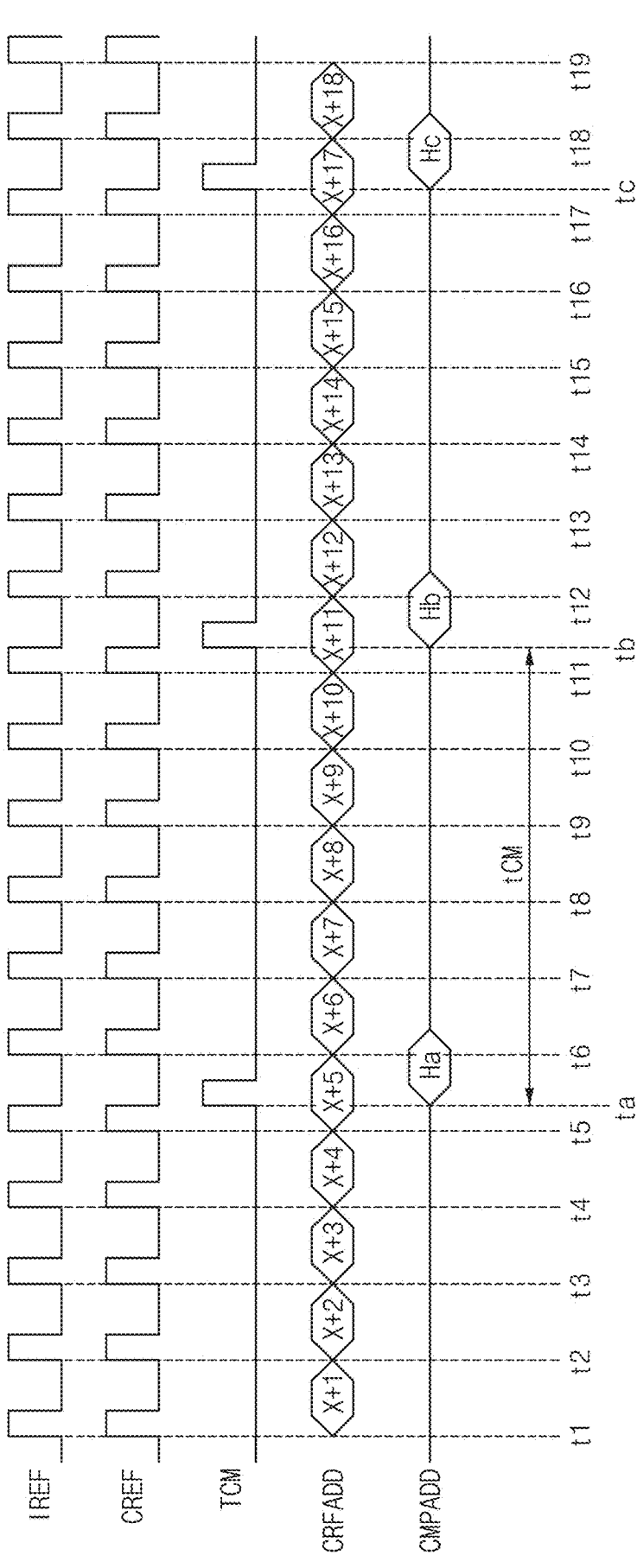

FIGS. 14A, 14B, and 14C are timing diagrams illustrating example operations of a refresh controller included in the semiconductor memory device of FIG. 3.

FIGS. 14A, 14B, and 14C illustrate generation of the counter refresh signal CREF, the compensation signal TCM, the counter refresh address signal CRFADD and compensation address signal HRFADD, with respect to a refresh signal IREF that is activated with a pulse shape. The intervals between activation time points t1 to t19 of the refresh signal IREF may be regular or irregular. In some example embodiments, the compensation signal TCM form the NBTI and/or PBTI compensation operation may be activated periodically by a compensation period tCM.

Referring to FIGS. 11 and 14A, the timing controller 510 may activate the counter refresh signal CREF in synchronization with time points t1 to t4, t6 to t10, t12 to t16, and t18 to t19 among the activation time points t1 to t19 of the refresh signal IREF, and may activate the compensation signal TCM in synchronization with the time points t5, t11 and t17. Even though FIG. 14A illustrates that the counter refresh signal CREF is activated five times for each activation of the compensation signal TCM, the activation ratio of the counter refresh signal CREF and the compensation signal TCM may be changed.

The refresh counter 121 may generate the counter refresh address signal CRFADD representing the sequentially changing addresses X+1 to X+15 in synchronization with the activation time points t1 to t4, t6 to t10, t12 to t16, and t18 to t19 of the counter refresh signal CREF. The compensation controller 600 may generate the compensation address signal CMPADD representing the addresses Ha, Hb, and Hc for the above-described PBTI compensation operation in synchronization with the activation time points t5, t11, and t17 of the compensation signal TCM.

Referring to FIGS. 11 and 14B, the timing controller 510 may activate the counter refresh signal CREF in synchronization with the activation time points t1 to t19 of the refresh signal IREF, and activate the compensation signal TCM in synchronization with the time points ta, tb, and tc while the refresh signal IREF is deactivated. Even though FIG. 14B illustrates that the counter refresh signal CREF is activated six times for each activation of the compensation signal TCM, the activation ratio of the counter refresh signal CREF and the compensation signal TCM may be changed.

The refresh counter 121 may generate the counter refresh address signal CRFADD representing the sequentially changing addresses X+1 to X+18 in synchronization with the activation time points t1 to t19 of the counter refresh signal CREF. The compensation controller 600 may generate the compensation address signal CMPADD representing the addresses Ha, Hb, and Hc for the above-described PBTI compensation operation in synchronization with the activation time points ta, tb, and tc of the compensation signal TCM.

Referring to FIGS. 11 and 14C, the timing controller 510 may activate the counter refresh signal CREF in synchronization with some the time points t1 to t4, t7 to t10, t13 to t16, and t19 among the activation time points t1 to t19 of the refresh signal IREF, and activate the compensation signal TCM in synchronization with the time points t5, t6, t11, t12, t17 and t18. Even though FIG. 14C illustrates that the counter refresh signal CREF is activated four times for every two activations of the compensation signal TCM, the activation ratio of the counter refresh signal CREF and the compensation signal TCM may be changed.

The refresh counter 121 may generate the counter refresh address signal CRFADD representing the sequentially changing addresses X+1 to X+12 in synchronization with the activation time points t1 to t4, t7 to t10, t13 to t16 and t19 of the counter refresh signal CREF. The compensation controller 600 may generate the compensation address CMPADD representing the addresses Ha, Hb, and Hc for the above-described PBTI compensation operation in synchronization with the activation time points t5, t6, t11, t12, t17, and t18 of the compensation signal TCM.

In one embodiment, as shown in FIGS. 14A and 14B, the compensation controller 600 may provide one compensation address each time the compensation signal TCM is activated. In another embodiment, as shown in FIG. 14C, the compensation controller 600 may sequentially provide two compensation addresses whenever the compensation signal TCM is activated.

Figure 15:
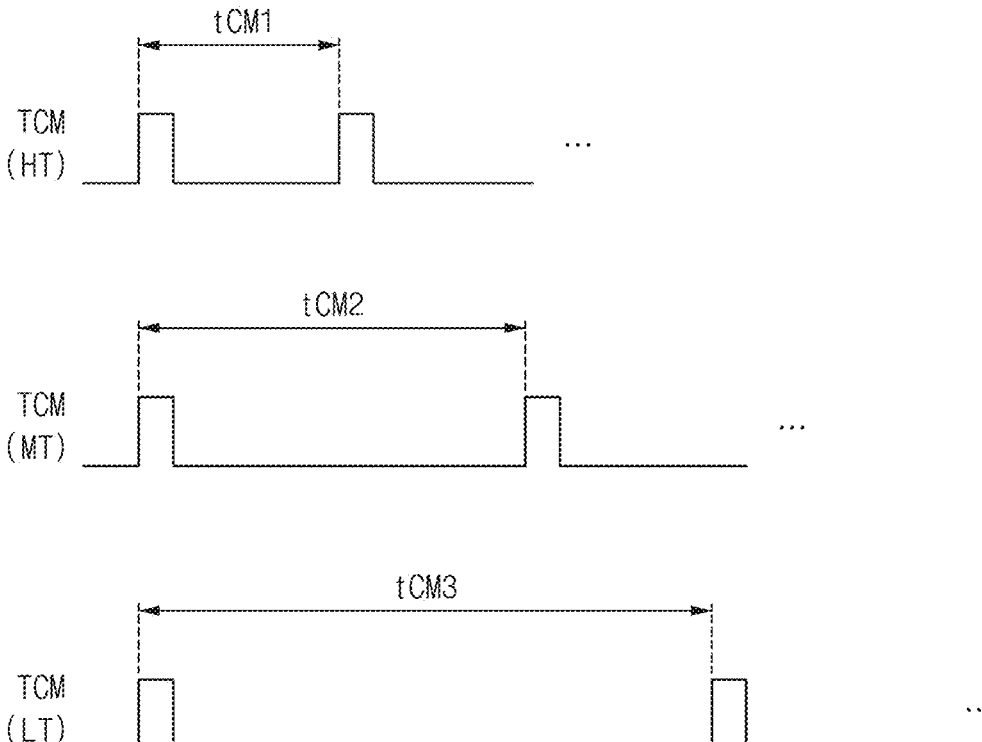
FIG. 15 is a diagram illustrating an adjustment of a compensation period in a method of operating a semiconductor memory device according to example embodiments.

FIG. 15 is a diagram illustrating an adjustment of a compensation period in a method of operating a semiconductor memory device according to example embodiments.

Referring to FIGS. 11 and 15, the compensation controller 600 may periodically perform the NBTI compensation operation and the PBTI compensation operation according to the compensation period, based on the compensation signal TCM activated every compensation period.

In FIG. 15, HT represents the case where the operation temperature of the semiconductor memory device is high temperature (e.g., 85° C. or higher), and MT represents the case where the operation temperature of the semiconductor memory device is medium temperature (e.g., between 85° C.

and 60° C.). LT indicates the case where the operation temperature of the semiconductor memory device is low (for example, 60° C. or less).

As shown in FIG. 15, the compensation period tCM2 at the medium temperature MT is set shorter than the compensation period tCM3 at the low temperature LT, and the compensation period tCM1 at the high temperature HT is set to be shorter than the compensation period tCM2) at the medium temperature MT. In other words, the compensation controller 600 may decrease the compensation period as the operation temperature of the semiconductor memory device increases.

Figure 16:
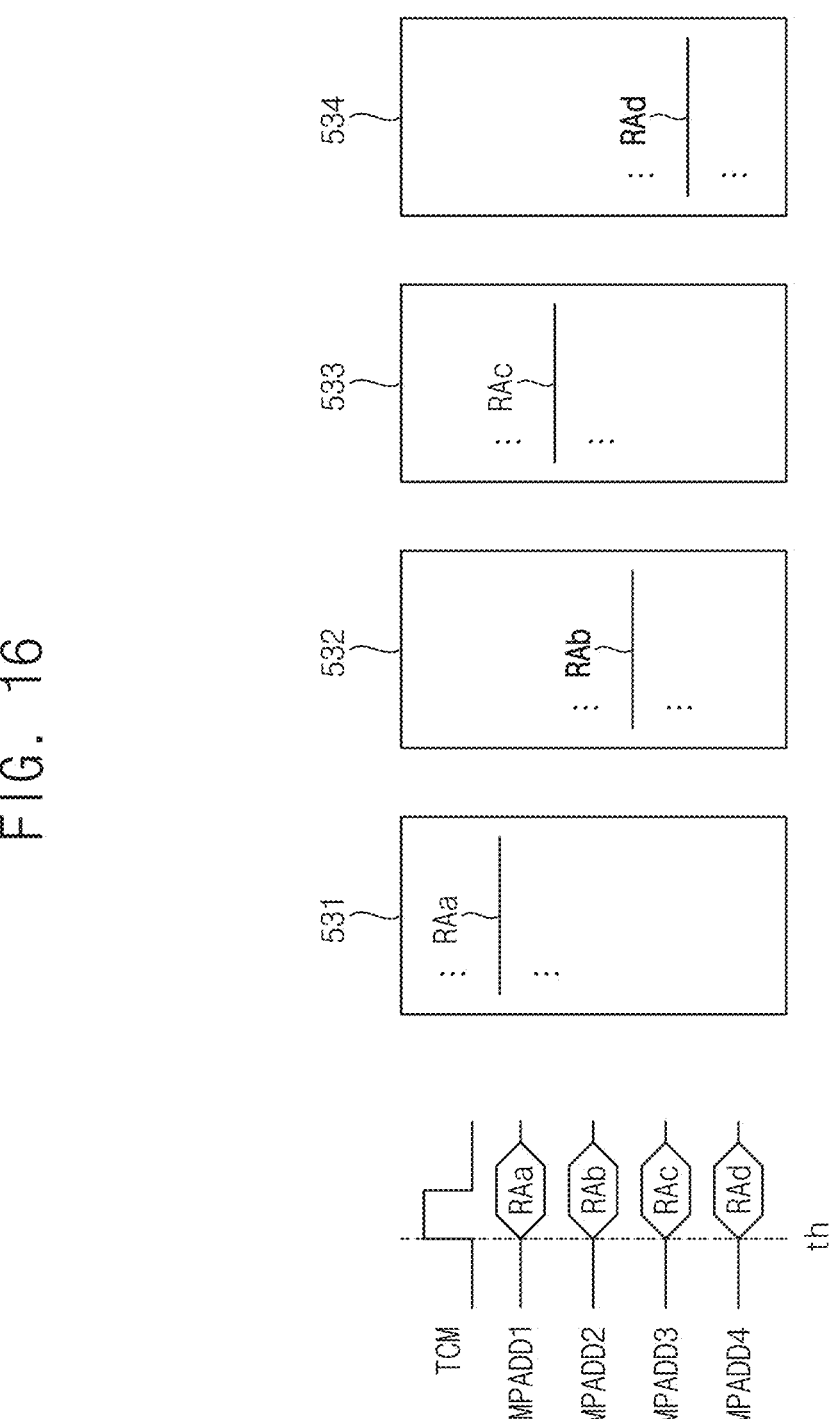
FIG. 16 is a diagram illustrating a compensation operation per memory bank of a semiconductor memory device according to example embodiments.

FIG. 16 is a diagram illustrating a compensation operation per memory bank of a semiconductor memory device according to example embodiments. Referring to FIGS. 11 and 16, at the activation time point $t_h$ of the compensation signal TCM, the compensation address signals CMPADD1, CMPADD2, CMPADD3, and CMPADD4 representing the compensation addresses RAa, RAb, RAc, and RAd may be provided to memory banks 531, 532, 533, and 534, respectively. As a result, the NBTI compensation operation may be performed simultaneously with respect to the memory cells included in rows having different addresses RAa, RAb, RAc, and RAd in the respective memory banks 531, 532, 533, and 534.

As such, the plurality of memory cells may be grouped into a plurality of memory banks, and the compensation controller 600 may independently perform the PBTI compensation operation and the NBTI compensation operation for each memory bank.

Figure 17:
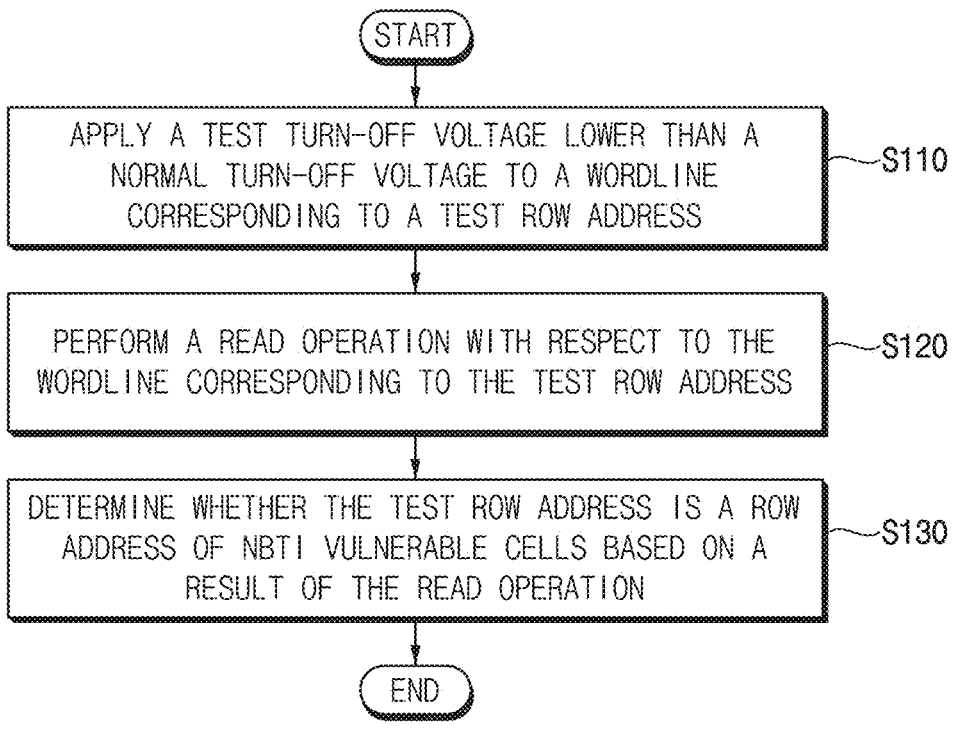
Figure 18:
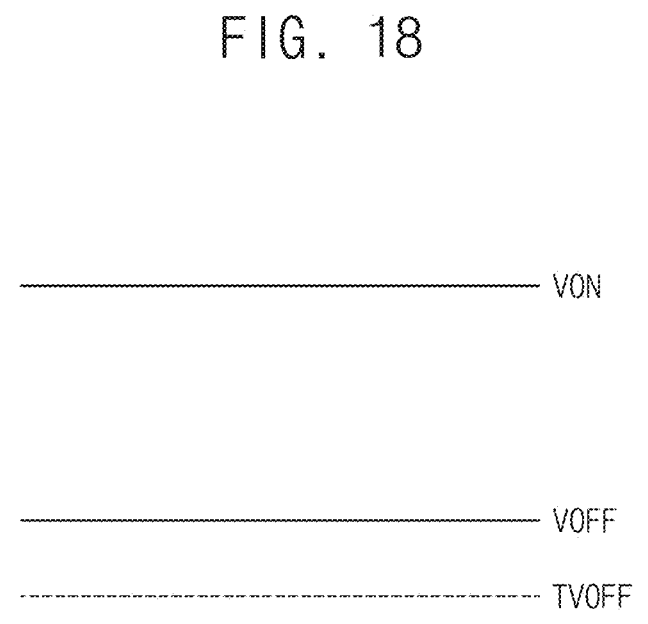

FIGS. 17 and 18 are diagrams illustrating an example embodiment of providing NBTI information in a method of operating a semiconductor memory device according to example embodiments.

Referring to FIGS. 3, 17, and 18, a test turn-off voltage TVOFF lower than the normal turn-off voltage VOFF may be applied to a wordline corresponding to a test row address (S110), for example, through a wafer-state test process. The test may be a burn-in test, and the test turn-off voltage TVOFF may be set lower than the compensation turn-off voltage CVOFF of FIG. 8 to reduce test time.

A read operation for the wordline corresponding to the test row address may be performed (S120). As will be described below with reference to FIG. 21, based on the result of the above read operation, it may be determined whether the test row address is a row address of an NBTI vulnerable cell (S130).

Figure 19:
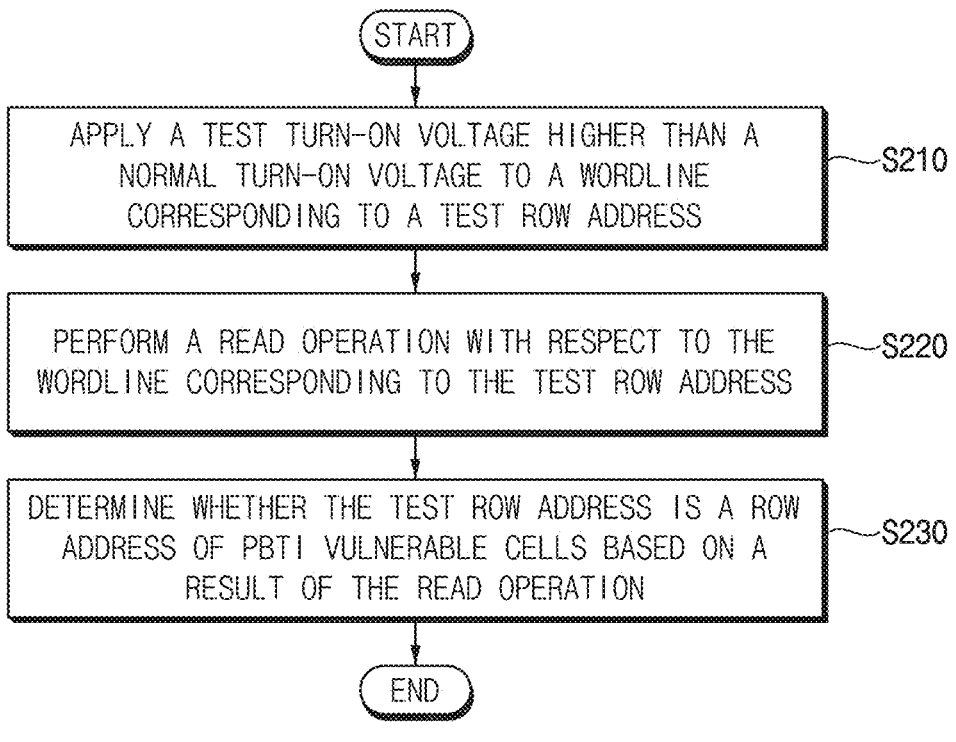
Figure 20:
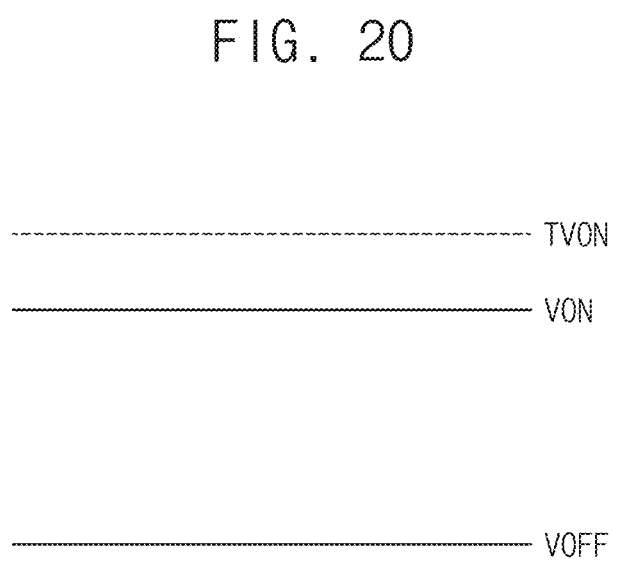

FIGS. 19 and 20 are diagrams illustrating an example embodiment of providing PBTI information in a method of operating a semiconductor memory device according to example embodiments.

Referring to FIGS. 3, 19, and 20, a test turn-on voltage, which is higher than the normal turn-on voltage VON, may be applied to a wordline corresponding to a test row address, for example, through a wafer-state test process (S210). The test may be a burn-in test, and the test turn-on voltage TVON may be set higher than the compensation turn-on voltage CVON of FIG. 6 to reduce the test time.

A read operation for the wordline corresponding to the test row address may be performed (S220). As will be described below with reference to FIG. 21, based on the result of the above read operation, it may be determined whether the test row address is a row address of a PBTI vulnerable cell (S230).

Figure 21:
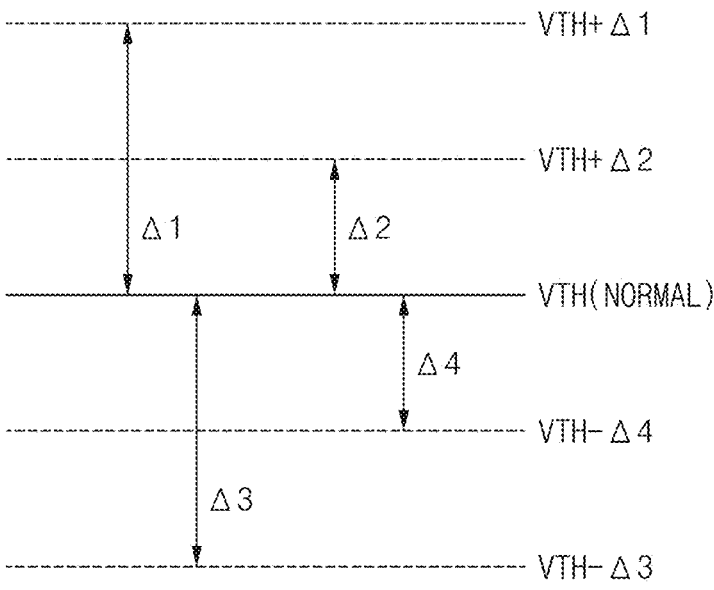
FIG. 21 is a diagram illustrating an example embodiment of determining a weak cell in a method of operating a semiconductor memory device according to example embodiments.

FIG. 21 is a diagram illustrating an example embodiment of determining a weak cell in a method of operating a semiconductor memory device according to example embodiments. Referring to FIG. 21, a defective cell and a weak cell may be determined based on a threshold voltage VTH (NORMAL) of a normal cell transistor before degeneration of NBTI and PBTI occurs.

Through the test process for generating the NBTI information, memory cells corresponding to the test row address may be determined as defective memory cells if the decrease in the threshold voltage of the cell transistor is greater than the first reference decrease value Δ3, that is, if the threshold voltage is decreased to be lower than VTH–Δ3. If the decrease in the threshold voltage of the cell transistor is less than the first threshold decrease value Δ3 and greater than the second threshold decrease value Δ4, that is, if the threshold voltage is between VTH–Δ3 and VTH–Δ4, the memory cells corresponding to the test row address may be determined as NBTI vulnerable cells as described above. The degree of NBTI degeneration may be detected by directly measuring the threshold voltage, or it may be estimated by applying dynamic test coverage. In this way, the NBTI compensation behavior may be efficiently performed based on the addresses of NBTI vulnerable cells determined during the test decision process.

On the other hand, through the test process for generating the PBTI information, the memory cells corresponding to the test row addresses may be determined as defective memory cells if the increase in the threshold voltage of the cell transistor is greater than the first reference increase value Δ1, that is, if the threshold voltage is increased more than VTH+Δ1. If the increase in the threshold voltage of the cell transistor is less than the first threshold decrease value Δ1 and greater than the second threshold increase value Δ2, that is, if the threshold voltage is between VTH+Δ1 and VTH+Δ2, the memory cells corresponding to the test row address may be determined as the PBTI vulnerable cells as described above. The degree of PBTI degeneration may be detected by directly measuring the threshold voltage, or may be estimated by applying test coverage associated with the increased resistance of the memory cell. In this way, the addresses of the PBTI vulnerable cells determined during the test process and the addresses of the PBTI vulnerable cells determined through the monitoring of the access addresses described above may be considered together to perform PBTI compensation behavior more efficiently. The defective cells may be screened out prior to shipment of the semiconductor memory device. The screening may include replacing the defective cells with redundant cells.

Hereinafter, a memory core circuit including a vertical channel transistor structure to which example embodiments may be applied will be described with reference to FIGS. 22, 23, and 24.

Figure 22:
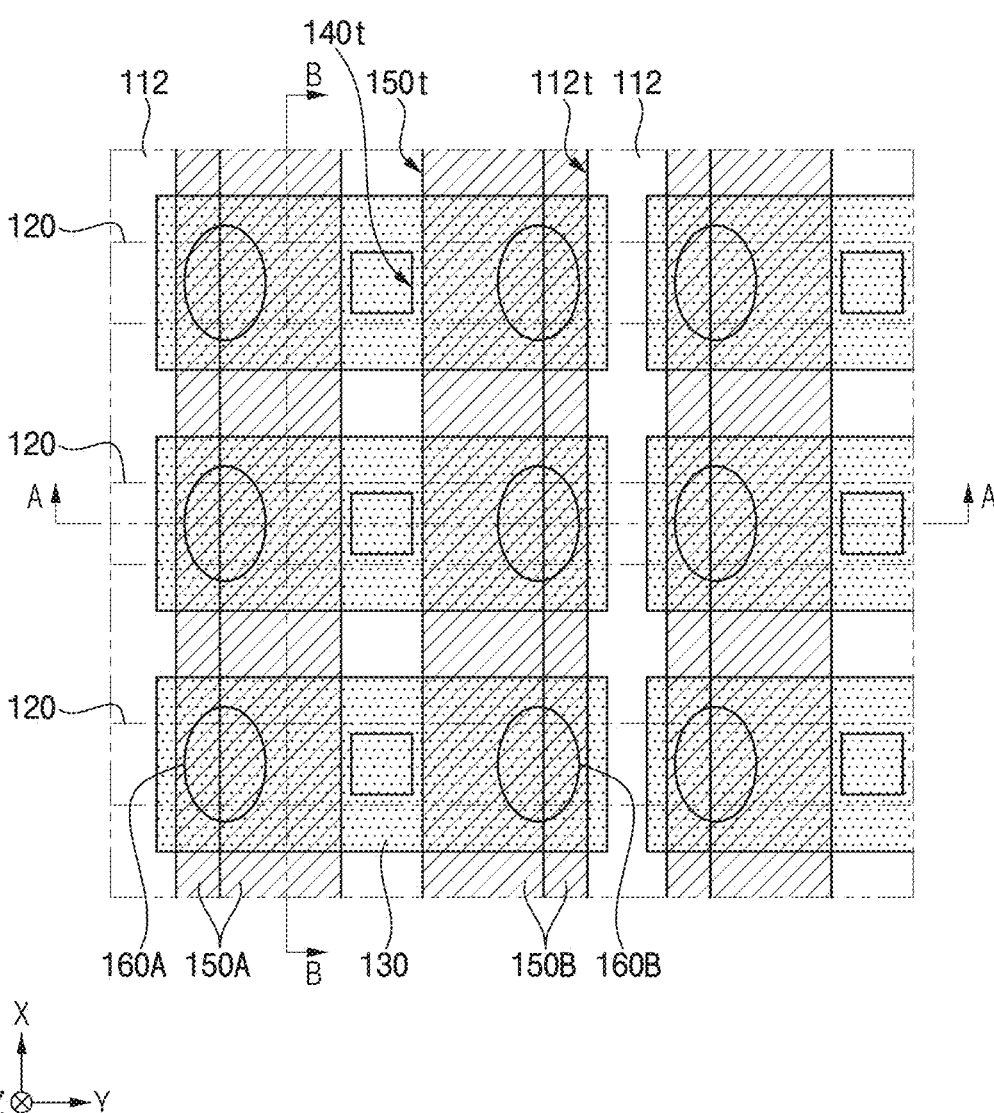
FIG. 22 is a diagram illustrating a schematic layout of a memory core circuit of a semiconductor memory device according to example embodiments.

FIG. 22 is a diagram illustrating a schematic layout of a memory core circuit of a semiconductor memory device according to example embodiments. FIG. 23 is a cross-sectional view taken along a line A-A in FIG. 22, and FIG. 24 is a cross-sectional view taken along a line B-B in FIG. 22.

Figure 23:
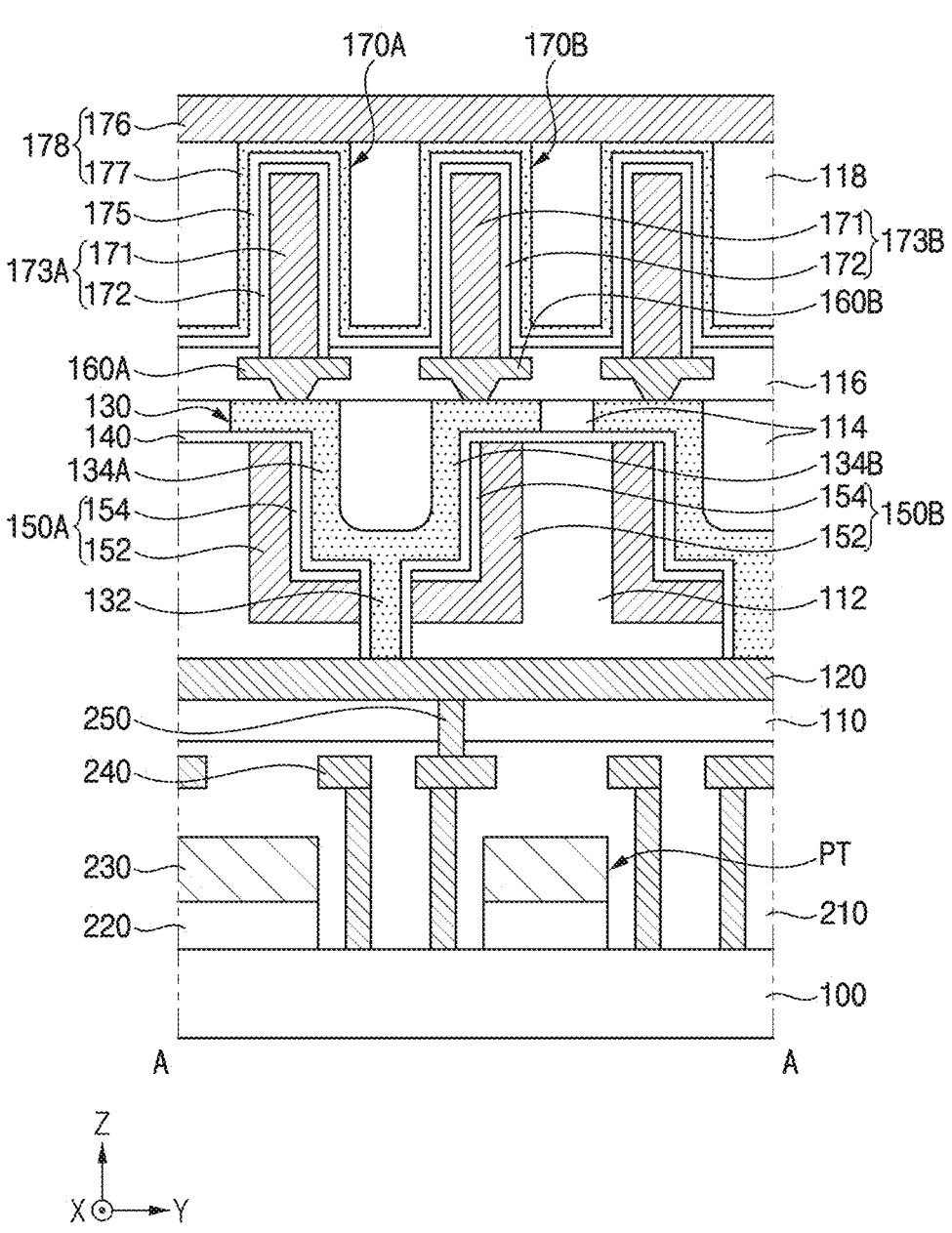
FIG. 23 is a cross-sectional view taken along a line A-A in FIG. 22.
Figure 24:
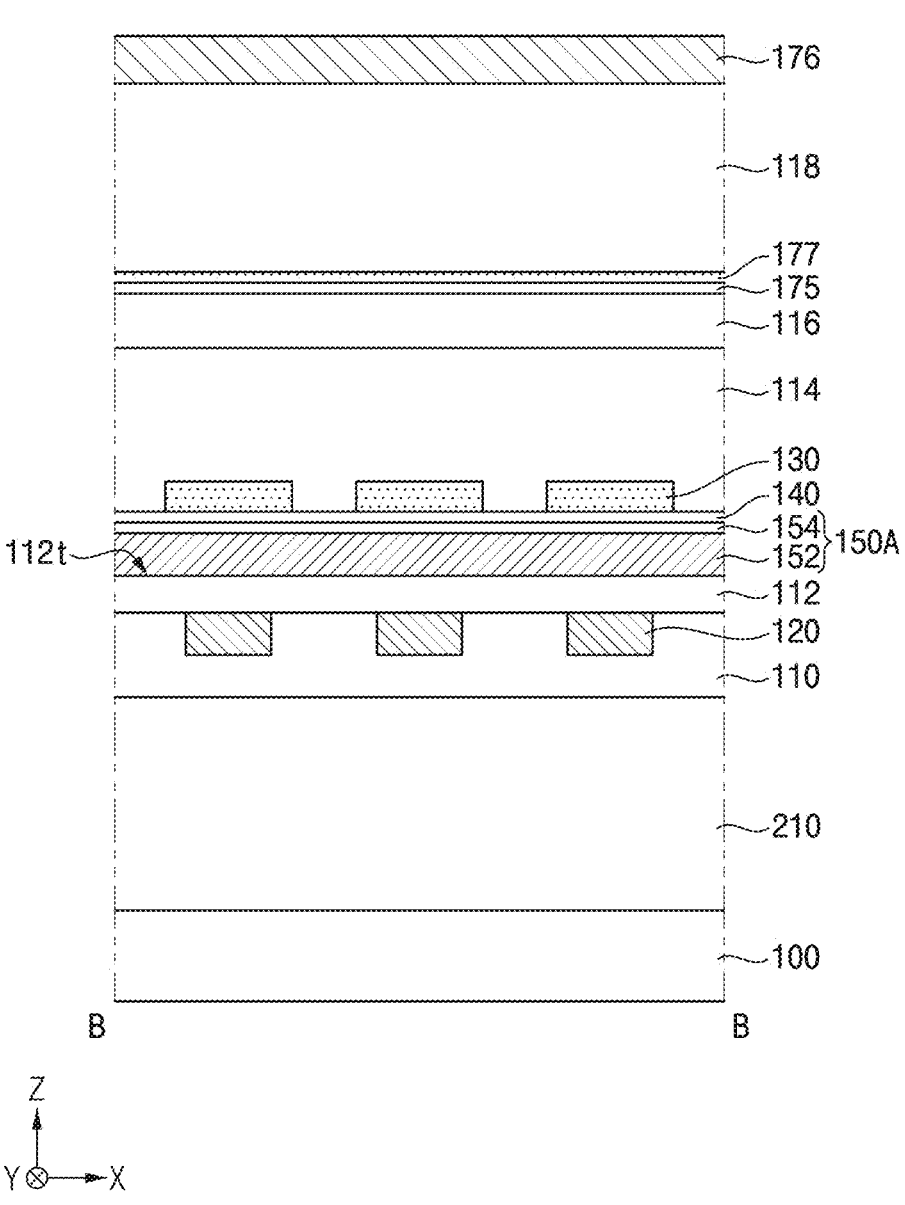
FIG. 24 is a cross-sectional view taken along a line B-B in FIG. 22.

Referring to FIGS. 22, 23, and 24, the semiconductor memory device according to some embodiments includes a first substrate 100, a conductive line 120, a first interlayer insulation film 112, gate electrodes 150A and 150B, a gate insulation layer 140, a channel layer 130, a second interlayer insulation film 114, landing pads 160A and 160B, and capacitor structures 170A and 170B. In some embodiments, the first substrate 100 may have a structure in which a base substrate and an epitaxial layer are stacked. The disclosure is not limited thereto. The first substrate 100 may be a silicon substrate, a gallium arsenide substrate, a silicon germanium substrate, or an SOI (Semiconductor On Insulator) substrate.

The conductive line 120 may be formed on the first substrate 100. For example, a lower insulation film 110 may be formed on the first substrate 100, and the conductive line 120 may be placed on the lower insulation film 110. The conductive line 120 may extend lengthwise in the column direction Y. The plurality of conductive lines 120 each extend in the column direction Y and may be spaced apart from each other at equal intervals in the row direction X that intersects the column direction Y. The lower insulation film 110 may be formed in (e.g., to fill) a space between the conductive lines 120. In some embodiments, an upper surface of the lower insulation film 110 may be placed at the same level as an upper surface of the conductive line 120. The conductive line 120 may function as a bitline of the semiconductor memory device according to some embodiments.

The conductive line 120 may include doped polysilicon, metal, conductive metal nitride, conductive metal silicide, conductive metal oxide, or combinations thereof. For example, the conductive line 120 may include, but is not limited to, doped polysilicon, aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminide (TiAl), titanium aluminum nitride (TiAlN), titanium silicide (TiSi), titanium silicon nitride (TiSiN), tantalum silicide (TaSi), tantalum silicon nitride (TaSiN), ruthenium titanium nitride (RuTiN), nickel silicide (NiSi), cobalt silicide (CoSi), iridium oxide (IrOx), ruthenium oxide (RuOx) or combinations thereof. Alternatively, the conductive line 120 may include a two-dimensional semiconductor material. The two-dimensional semiconductor material may include, for example, graphene, carbon nanotube, or a combination thereof. The conductive line 120 may include a single layer or multiple layers of the conductive materials described above.

The first interlayer insulation film 112 may be formed on the first substrate 100. The first interlayer insulation film 112 may include (e.g., define) a cell trench 112t that extends lengthwise in the row direction X and crosses the conductive line 120. The plurality of cell trenches 112t each extend in the row direction X and may be spaced apart from each other at equal intervals in the column direction Y. Therefore, each of the first interlayer insulation films 112 may form pin-shaped insulating patterns that extend in the row direction X and are spaced apart from each other by the cell trench 112t.

In some embodiments, the first interlayer insulation film 112 may be placed on the upper surface of the lower insulation film 110 to cover the conductive line 120. In some embodiments, a lower portion/surface of the cell trench 112t may be spaced apart from the upper surface of the conductive line 120. In some embodiments, a width of the cell trench 112t may decrease toward the upper surface of the first substrate 100. Here, the width of the cell trench 112t means a width in the column direction Y. This decrease in width may be due to the characteristics of an etching process for forming the cell trench 112t.

The first interlayer insulation film 112 may include, for example, but is not limited to, at least one of silicon oxide, silicon oxynitride, silicon nitride, and a low dielectric constant (low-k) material having a lower dielectric constant than silicon oxide. The gate electrodes 150A and 150B may be formed in the cell trench 112t. For example, the gate electrodes 150A and 150B may extend along the lower surface and the side surfaces of the cell trench 112t. Also, the gate electrodes 150A and 150B may each extend lengthwise in the row direction X and cross the conductive line 120.

In some embodiments, the gate electrodes 150A and 150B may include a first gate electrode 150A and a second gate electrode 150B that are spaced apart from each other in the column direction Y. The first gate electrode 150A and the second gate electrode 150B may face each other in the cell trench 112t. For example, the first gate electrode 150A may extend along the lower surface and a first side surface of the cell trench 112t, and the second gate electrode 150B may extend along the lower surface of the cell trench 112t and a second side surface thereof facing the first side surface. As an example, in a cross section intersecting the row direction X (e.g., in FIG. 23), the gate electrodes 150A and 150B may each have an "L" shape. The first gate electrode 150A may function as a first wordline of the semiconductor memory device according to some embodiments, and the second gate electrode 150B may function as a second wordline of the semiconductor memory device according to some embodiments.

In some embodiments, a separation trench 150t may be formed in the first interlayer insulation film 112 and the gate electrodes 150A and 150B. The separation trench 150t may extend in the row direction X to separate the first gate electrode 150A and the second gate electrode 150B. Further, the separation trench 150t may overlap (e.g., expose) a part of the conductive line 120. For example, a lower portion/surface of the separation trench 150t may overlap/expose a part of the upper surface of the conductive line 120.

The gate electrodes 150A and 150B may each include doped polysilicon, metal, conductive metal nitride, conductive metal silicide, conductive metal oxide, or a combination thereof. For example, the gate electrodes 150A and 150B may include, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or combinations thereof.

In some embodiments, the first gate electrode 150A and the second gate electrode 150B may each include a first conductive pattern 152 and a first barrier conductive film 154. The first conductive pattern 152 and the first barrier conductive film 154 may be sequentially stacked in the cell trench 112t. For example, the first conductive pattern 152 may conformally extend along the lower surface and the side surfaces of the cell trench 112t. The first barrier conductive film 154 may conformally extend along the profile of the first conductive pattern 152. The first barrier conductive film 154 may be interposed between the first conductive pattern 152 and a gate insulation layer 140 to be described below.

The first barrier conductive film 154 may reduce/prevent diffusion of the elements included in the first conductive pattern 152. As an example, the first conductive pattern 152 may include at least one of tungsten (W), aluminum (Al), and copper (Cu), and the first barrier conductive film 154 may include at least one of titanium (Ti), titanium nitride (TiN), tantalum (Ta), and tantalum nitride (TaN).

The gate insulation layer 140 may be stacked on the gate electrodes 150A and 150B. For example, the gate insulation layer 140 may conformally extend along the profile of the gate electrodes 150A and 150B. The gate insulation layer 140 may be interposed between the gate electrodes 150A and 150B and a channel layer 130 to be described below. In some embodiments, the gate insulation layer 140 may further extend along the upper surface of the first interlayer insulation film 112. In some embodiments, the gate insulation layer 140 may extend along the side surfaces of the separation trench 150*t*.

In some embodiments, the gate insulation layer 140 may have a gap/opening therein that overlaps (e.g., exposes) a part of the conductive line 120. For example, the gate insulation layer 140 may include a contact trench 140*t* inside the separation trench 150*t*. The lower portion/surface of the contact trench 140*t* may overlap/expose a part of the upper surface of the conductive line 120. FIG. 22 shows that the contact trench 140*t* has a rectangular shape. As another example, the contact trench 140*t* may have a circular or other polygonal shape. Also, FIG. 22 shows that one contact trench 140*t* overlaps/exposes one conductive line 120. As another example, one contact trench 140*t* may extend lengthwise in the row direction X to overlap/expose the plurality of conductive lines 120.

The gate insulation layer 140 may include silicon oxide, silicon oxynitride, a high dielectric constant material having a higher dielectric constant than silicon oxide, or a combination thereof. The high dielectric constant material may include, but is not limited to, for example, hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide (ZrO2), aluminum oxide (A12O3), or a combination thereof.

In some embodiments, the gate insulation layer 140 may provide the semiconductor memory device according to some embodiments as a ferroelectric memory element (ferroelectric RAM, FeRAM). As an example, the gate insulation layer 140 may include ferroelectrics such as barium titanate (BaTiO3), lead zirconate titanate (PbZrTiO3, PZT), strontium bismuth tantalate (STB; SrBi2Ta2O9), bismuth iron oxide (BiFeO3, BFO), and hafnium oxide (HfO2).

The channel layer 130 may be stacked on (e.g., on an upper surface of) the gate insulation layer 140. The channel layer 130 may be inside (e.g., may fill at least a part of) the cell trench 112*t*. For example, the channel layer 130 may extend along the profiles of the gate electrodes 150A and 150B and the gate insulation layer 140. Therefore, each of the gate electrodes 150A and 150B and the gate insulation layer 140 may be interposed between the first interlayer insulation film 112 and the channel layer 130.

The channel layer 130 may be connected to the conductive line 120. In some embodiments, the channel layer 130 may be electrically connected to the upper surface of the conductive line 120 by extending through the separation trench 150*t* and the contact trench 140*t*. As shown in FIG. 22, the plurality of channel layers 130 are spaced apart from each other in the column direction Y and the row direction X, and may be arranged in a matrix form.

In the semiconductor memory device according to some embodiments, the channel layer 130 may include a first source/drain region and a second source/drain region that are arranged along the vertical direction Z that intersects the column direction Y and the row direction X. For example, the lower part of the channel layer 130 may function as a first source/drain region, and the upper part of the channel layer 130 may function as a second source/drain region. A part of the channel layer 130 between the first source/drain region and the second source/drain region may function as a channel region.

The channel layer 130 may include a semiconductor material. As an example, the channel layer 130 may include an oxide semiconductor material. The oxide semiconductor material may reduce a leakage current of the semiconductor memory device. The oxide semiconductor material may include, for example, IGZO (indium gallium zinc oxide, InxGayZnzO), IGSO (indium gallium silicon oxide, InxGaySizO), ITZO (indium tin zinc oxide, InxSnyZnzO), IZO (indium zinc oxide, InxZnyO), ZnO (zinc oxide, ZnxO), ZTO (zinc tin oxide, ZnxSnyO), ZnON (zinc oxynitride, ZnxOyN), ZZTO (zirconium zinc tin oxide, ZrxZnySnzO), SnO (tin oxide, SnxO), HIZO (hafnium indium zinc oxide, HfxInyZnzO), GZTO (gallium zinc tin oxide, GaxZnySnzO), AZTO (aluminum zinc tin oxide, AlxZnySnzO), YGZO (ytterbium gallium zinc oxide, YbxGayZnzO), IGO (indium gallium oxide, InxGayO) or a combination thereof.

As another example, the channel layer 130 may include silicon (Si) and germanium (Ge) as elemental semiconductor materials, or materials doped to them. Alternatively, the channel layer 130 may also include a group IV-IV compound semiconductor or a group III-V compound semiconductor. The group IV-IV compound semiconductor may be, for example, a binary compound or a ternary compound including at least two or more of carbon (C), silicon (Si), germanium (Ge), and tin (Sn), or a compound obtained by doping these elements with a group IV element.

As another example, the channel layer 130 may include a two-dimensional semiconductor material. The two-dimensional semiconductor material may include, for example, graphene, carbon nanotube, transition metal dichalcogenide (TMD), or a combination thereof. The TMD may include, for example, one metal element among Mo, W, Nb, vanadium (V), Ta, Ti, Zr, Hf, technetium (Tc), rhenium (Re), Cu, Ga, In, Sn, Ge, and Pb, and one chalcogen element among sulfur(S), selenium (Se), and tellurium (Te).

According to some embodiments, the channel layer 130 may include a single layer or multiple layers of the semiconductor materials described above. Preferably, the channel layer 130 may include IGZO. And, in other embodiments, the channel layer 130 may have a bandgap energy that is greater than a bandgap energy of silicon (Si). For example, the channel layer 130 may have a bandgap energy of about 1.5 electron volts (eV) to 5.6 eV. Preferably, the channel layer 130 may have a bandgap energy of about 2.0 eV to 4.0 eV. The channel layer 130 may be, but is not limited to, for example, polycrystalline or amorphous.

As shown, the channel layer 130 may be a continuous layer that includes each of a penetration portion 132, a first extension portion 134A, and a second extension portion 134B. The penetration portion 132 may be interposed between the first gate electrode 150A and the second gate electrode 150B. The penetration portion 132 may penetrate the first interlayer insulation film 112 and be connected (e.g., electrically connected) to the conductive line 120. For example, the penetration portion 132 may be inside (e.g., may fill) the contact trench 140*t*. The first extension portion 134A may extend from the penetration portion 132 along the side surfaces of the first gate electrode 150A. The second extension portion 134B may extend from the penetration portion 132 along the side surfaces of the second gate electrode 150B.

In the semiconductor memory device according to some embodiments, the first extension portion 134A may function as a first channel region of a first transistor including the first gate electrode 150A, and the second extension portion 134B may function as a second channel region of a second transistor including the second gate electrode 150B. Accordingly, two transistor structures may be provided for each channel layer 130.

In some embodiments, the first extension portion 134A and the second extension portion 134B may face (e.g., may be opposite, in parallel with) each other inside the cell trench 112*t*. As an example, in a cross section intersecting the row direction X (e.g., in FIG. 23), the first extension portion 134A and the second extension portion 134B may collectively have a "U" shape.

In some embodiments, a part of the first extension portion 134A and a part of the second extension portion 134B may be placed on the upper surface of the first interlayer insulation film 112. For example, the first extension portion 134A may further extend along the upper surface of the first gate electrode 150A, and the second extension portion 134B may further extend along the upper surface of the second gate electrode 150B.

The second interlayer insulation film 114 may be formed on the channel layer 130. For example, the second interlayer insulation film 114 may be formed on the gate insulation layer 140. The second interlayer insulation film 114 may separate a plurality of channel layers 130 that are spaced apart from each other and arranged in a matrix form. In some embodiments, the upper surface of the second interlayer insulation film 114 may be placed at the same level as the upper surface of the channel layer 130. That is, the second interlayer insulation film 114 may be on (e.g., may cover) the side surfaces of the channel layer 130. In some embodiments, the second interlayer insulation film 114 may be interposed between the first extension portion 134A and the second extension portion 134B. For example, the second interlayer insulation film 114 may be formed on the channel layer 130 to fill the cell trench 112*t*. This second interlayer insulation film 114 may include, but is not limited to, for example, at least one of silicon oxide, silicon oxynitride, silicon nitride, and a low dielectric constant (low-k) material having a lower dielectric constant than silicon oxide.

Landing pads 160A and 160B may be formed on the first interlayer insulation film 112 and the second interlayer insulation film 114. Each of the landing pads 160A and 160B may be electrically connected to the channel layer 130. For example, a third interlayer insulation film 116 may be formed on the first interlayer insulation film 112 and the second interlayer insulation film 114. The landing pads 160A and 160B are each formed in the third interlayer insulation film 116 and may be electrically connected to the upper part of the channel layer 130.

In some embodiments, each of the landing pads 160A and 160B may be placed to overlap at least a part of the channel layer 130 in the vertical direction Z. A plurality of landing pads 160A and 160B are spaced apart from each other in the column direction Y and the row direction X, and may be arranged in a matrix form. However, this is only an example, and the placement of the landing pads 160A and 160B is not limited, as long as the landing pads are electrically connected to the channel layer 130. As another example, the plurality of landing pads 160A and 160B may also be arranged in a honeycomb form.

In some embodiments, the landing pads 160A and 160B may include a first landing pad 160A and a second landing pad 160B that are spaced from each other in the column direction Y. The first landing pad 160A may be in contact with one end (e.g., a first end) of the channel layer 130 adjacent to the first gate electrode 150A, and the second landing pad 160B may be in contact with the other end (e.g., a second end that is opposite the first end) of the channel layer 130 adjacent to the second gate electrode 150B. For example, the first landing pad 160A may be in contact with the first extension portion 134A, and the second landing pad 160B may be in contact with the second extension portion 134B.

In some embodiments, the first landing pad 160A may be in contact with the upper surface of the first extension portion 134A that extends along the upper surface of the first gate electrode 150A, and the second landing pad 160B may be in contact with the upper surface of the second extension portion 134B that extends along the upper surface of the second gate electrode 150B.

The drawings show that the first landing pad 160A overlaps the first gate electrode 150A in the vertical direction Z, and the second landing pad 160B overlaps the second gate electrodes 150B in the vertical direction Z. In some embodiments, as long as each of the first landing pad 160A and the second landing pad 160B is electrically connected to the channel layer 130, the placement of the first landing pad 160A and the second landing pad 160B may vary. In some embodiments, the landing pads 160A and 160B may each include doped polysilicon, metal, conductive metal nitride, conductive metal silicide, conductive metal oxide, or a combination thereof. For example, the landing pads 160A and 160B may include, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or combinations thereof.

The capacitor structures 170A and 170B may be formed on the landing pads 160A and 160B. The capacitor structures 170A and 170B may be arranged to correspond to the landing pads 160A and 160B. The landing pads 160A and 160B may electrically connect the channel layer 130 and the capacitor structures 170A and 170B. The capacitor structures 170A and 170B may each include lower electrodes 173A and 173B, a capacitor dielectric layer 175, and an upper electrode 178.

In some embodiments, the capacitor structures 170A and 170B may provide the semiconductor memory device according to some embodiments as a dynamic memory element (dynamic RAM, DRAM). For example, the capacitor structures 170A and 170B may store the data (charge) inside the capacitor dielectric layer 175, by utilizing a potential difference occurring between the lower electrodes 173A and 173B and the upper electrode 178.

The lower electrodes 173A and 173B may be electrically connected to the landing pads 160A and 160B. Each of the lower electrodes 173A and 173B may have, but are not limited to, a pillar shape extending in the vertical direction Z. In some embodiments, the lower electrodes 173A and 173B may be placed to overlap the landing pads 160A and 160B in the vertical direction Z. For example, a plurality of lower electrodes 173A and 173B may be spaced apart from each other in the column direction Y and the row direction X, and may be arranged in a matrix form.

In some embodiments, the lower electrodes 173A and 173B may be spaced apart from each other in the column direction Y. The lower electrode 173A may be in contact with the upper surface of the first landing pad 160A, and the lower electrode 173B may be in contact with the upper surface of the second landing pad 160B. Therefore, the capacitor structures 170A and 170B may include a first capacitor structure 170A and a second capacitor structure 170B arranged along the column direction Y.

The capacitor dielectric layer 175 may be interposed between the lower electrodes 173A and 173B and the upper electrodes 178. As an example, the capacitor dielectric layer 175 may conformally extend along outer peripheral surfaces of the lower electrodes 173A and 173B and the upper surface of the third interlayer insulation film 116. The upper electrode 178 may be formed on the upper surface of the capacitor dielectric layer 175.

In some embodiments, the upper electrode 178 may be a plate-shaped structure that extends along a plane that intersects the vertical direction Z. As an example, a fourth interlayer insulation film 118 that fills the space between the lower electrodes 173A and 173B may be formed on the capacitor dielectric layer 175. The upper electrode 178 may extend along the upper surface of the fourth interlayer insulation film 118. However, this is only one example, and the fourth interlayer insulation film 118 may be omitted. As another example, the upper electrode 178 may be formed on the capacitor dielectric layer 175 to fill the space between the lower electrodes 173A and 173B.

The lower electrodes 173A and 173B and the upper electrode 178 may each include doped polysilicon, metal, conductive metal nitride, conductive metal silicide, conductive metal oxide, or a combination thereof. For example, the lower electrodes 173A and 173B and the upper electrode 178 may include, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or combinations thereof.

The capacitor dielectric layer 175 may include silicon oxide, silicon oxynitride, a high dielectric constant material having a higher dielectric constant than silicon oxide, or a combination thereof. The high dielectric constant material may include, but is not limited to, hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide (ZrO2), aluminum oxide (Al2O3) or a combination thereof.

In some embodiments, each of the lower electrode 173A and the lower electrode 173B may include a second conductive pattern 171 and a second barrier conductive film 172. The second conductive pattern 171 and the second barrier conductive film 172 may be sequentially stacked on the landing pads 160A and 160B. For example, the second conductive pattern 171 may have a pillar shape extending in the vertical direction Z on the landing pads 160A and 160B. The second barrier conductive film 172 may conformally extend along the side surfaces and the upper surface of the second conductive pattern 171. The second barrier conductive film 172 may be interposed between the second conductive pattern 171 and the capacitor dielectric layer 175.

The second barrier conductive film 172 may reduce/prevent diffusion of the elements included in the second conductive pattern 171. As an example, the second conductive pattern 171 may include at least one of tungsten (W), aluminum (Al), and copper (Cu), and the second barrier conductive film 172 may include at least one of titanium (Ti), titanium nitride (TiN), tantalum (Ta), and tantalum nitride (TaN).

In some embodiments, the upper electrode 178 may include a third barrier conductive film 177 and a third conductive pattern 176. The third barrier conductive film 177 and the third conductive pattern 176 may be sequentially stacked on the capacitor dielectric layer 175. For example, the third barrier conductive film 177 may conformally extend along the capacitor dielectric layer 175. In some embodiments, the third barrier conductive film 177 may extend between the capacitor dielectric layer 175 and the fourth interlayer insulation film 118.

The third conductive pattern 176 may be a plate-like structure extending along a plane intersecting the vertical direction Z. The third conductive pattern 176 may extend along the uppermost surface of the third barrier conductive film 177. In some embodiments, the third conductive pattern

176 may extend along the upper surface of the fourth interlayer insulation film 118. For example, the upper surface of the fourth interlayer insulation film 118 may be placed at the same level as the uppermost surface of the third barrier conductive film 177.

The third barrier conductive film 177 may reduce/prevent diffusion of the elements included in the third conductive pattern 176. As an example, the third conductive pattern 176 may include at least one of tungsten (W), aluminum (Al), and copper (Cu), and the third barrier conductive film 177 may include at least one of titanium (Ti), titanium nitride (TiN), tantalum (Ta), and tantalum nitride (TaN).

In order to improve the degree of integration of the semiconductor memory device, semiconductor memory devices including a vertical channel transistor with channels extending in the vertical direction are proposed. In order to implement such semiconductor memory devices, a gate insulation layer and a gate electrode may be stacked on the side surfaces of the channel layer extending in the vertical direction. However, in such a case, the channel layer may be damaged or its characteristics may be deteriorated in the process of forming the gate insulation layer and the gate electrode, which may include thermal processes or the like, and may cause a decrease in performance and reliability of the semiconductor memory device.

In the semiconductor memory device according to some embodiments, the channel layer 130 may be formed by being stacked on the gate electrodes 150A and 150B and the gate insulation layer 140. Therefore, a semiconductor memory device with improved performance and reliability may be provided. In addition, the semiconductor memory device according to some embodiments may have two transistor structures for each channel layer 130. For example, as described above, the gate electrodes 150A and 150B may include a first gate electrode 150A and a second gate electrode 150B that are spaced apart from each other in the cell trench 112*t*. Accordingly, it is possible to provide a semiconductor memory device having higher degrees of integration.

Furthermore, in the semiconductor memory device according to some embodiments, a part of the channel layer 130 may be placed on the upper surface of the first interlayer insulation film 112. For example, as described above, the first extension portion 134A may further extend along the upper surface of the first gate electrode 150A, and the second extension portion 134B may further extend along the upper surface of be the second gate electrode 150B. In such a case, the distance between the landing pads 160A and 160B and the gate electrodes 150A and 150B may be adjusted by the thickness of the channel layer 130. Therefore, it is possible to provide the semiconductor memory device according to some embodiments in which the distance between the landing pads 160A and 160B and the gate electrodes 150A and 150B may be easily adjusted.

The peripheral circuit element PT and the inter-wiring insulation film 210 may be formed on the first substrate 100. The peripheral circuit element PT may control the functions of the semiconductor memory elements formed on the first substrate 100, including control elements and dummy elements. The inter-wiring insulation film 210 may cover the peripheral circuit element PT. In some embodiments, the peripheral circuit element PT may include a fourth conductive pattern 220 and a fifth conductive pattern 230 that are sequentially formed on the upper surface of the first substrate 100. The fourth conductive pattern 220 and the fifth conductive pattern 230 may form various circuit elements for controlling the functions of the semiconductor memory elements. The peripheral circuit element PT may include, for example, not only various active elements such as a transistor, but also various passive elements such as a capacitor, a resistor, and an inductor, and combinations thereof.

In some embodiments, the peripheral circuit element PT and the inter-wiring insulation film 210 may be placed under the first interlayer insulation film 112. For example, the lower insulation film 110 may be stacked on the upper surface of the inter-wiring insulation film 210. The first interlayer insulation film 112 may be stacked on the upper surface of the lower insulation film 110. That is, the semiconductor memory device according to some embodiments may have a CoP (cell on periphery) structure.

In some embodiments, the peripheral circuit element PT may be electrically connected to the conductive line 120. For example, a wiring pattern 240 electrically connected to the peripheral circuit element PT may be formed in the inter-wiring insulation film 210. In addition, a connecting via 250 that penetrates the lower insulation film 110 and electrically connects the conductive line 120 and the wiring pattern 240 may be formed. Therefore, the conductive line 120 may be electrically controlled by the peripheral circuit element PT.

Figure 25:
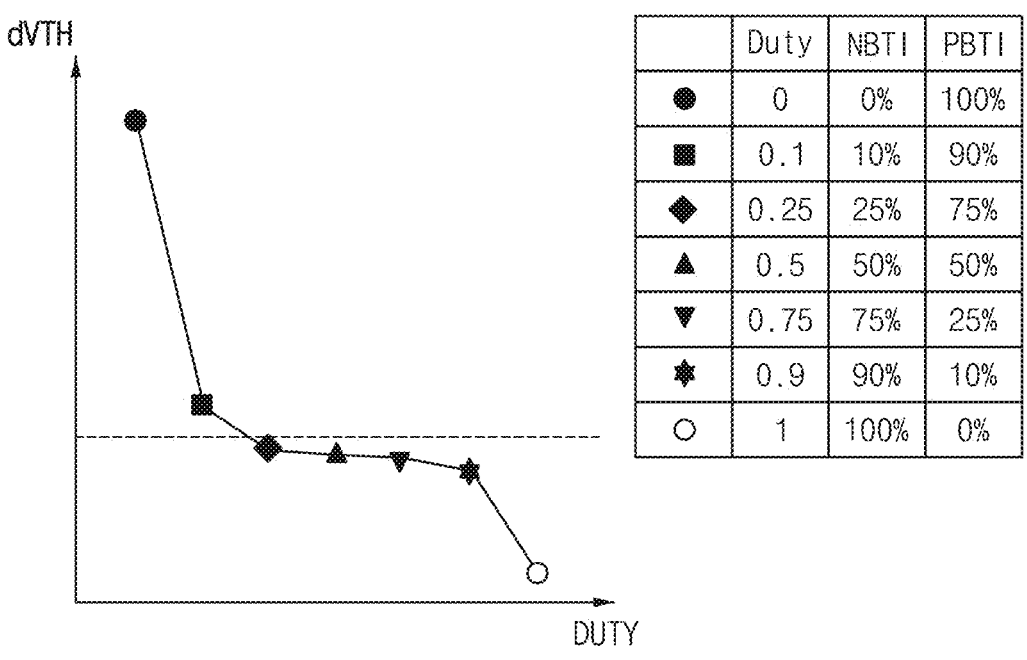
FIG. 25 is a diagram illustrating NBTI and PBTI characteristics of an Indium gallium zinc oxide (IGZO) vertical channel transistor.

FIG. 25 is a diagram illustrating NBTI and PBTI characteristics of an IGZO vertical channel transistor.

In FIG. 25, the horizontal axis represents the duty ratio and the vertical axis represents the change in threshold voltage dVTH of the vertical channel transistor. The duty ratio represents the ratio of the applied time of the normal turn-off voltage VOFF to the elapsed time. FIG. 25 is an example of a characterization of NBTI and PBTI as a function of duty ratio, and the variation in FIG. 25 may vary depending on the configuration and characteristics of the memory cells.

As shown in FIG. 25, as the duty ratio decreases, PBTI degeneration becomes dominant, and at zero duty ratio, the PBTI effect becomes 100% due to electron traps in the channel layer. On the other hand, it may be seen that as the duty ratio increases, NBTI degeneration dominates and the NBTI effect becomes 100% at a duty ratio of 1.

Referring to FIGS. 22, 23, and 24, the above-described memory cells using IGZP vertical channel transistors have both NBTI degeneration characteristics and PBTI degeneration characteristics, and the operation methods of the semiconductor memory devices according to the above-described example embodiments may be more usefully applied to semiconductor memory devices including memory cells using IGZP vertical channel transistors.

Figure 26:
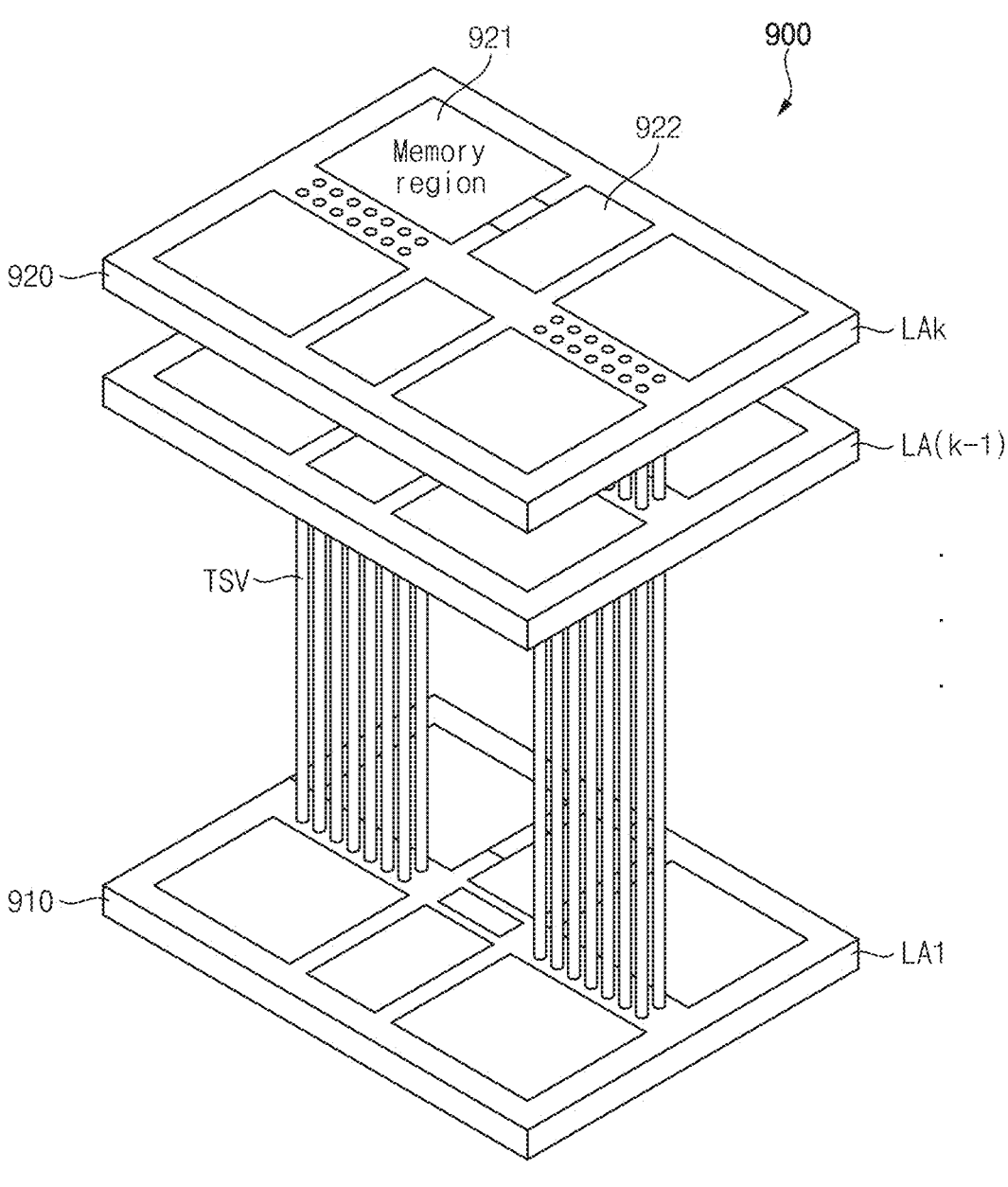
FIGS. 26 and 27 are diagrams illustrating a stacked semiconductor memory device according to example embodiments.
Figure 27:
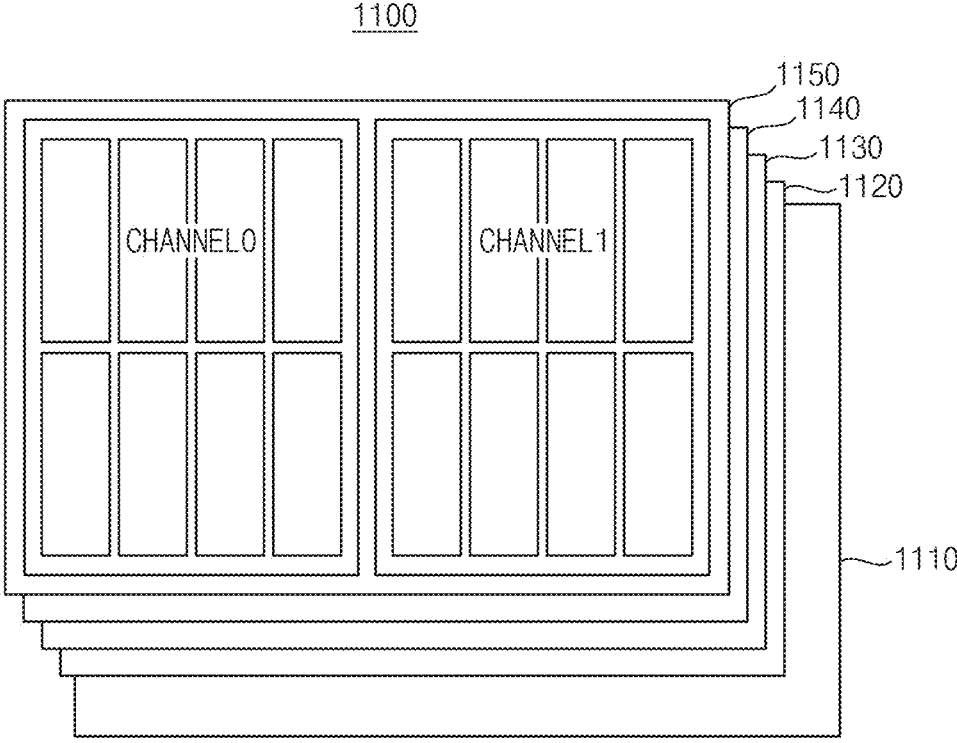

FIGS. 26 and 27 are diagrams illustrating a stacked semiconductor memory device according to example embodiments.

Referring to FIG. 26, a semiconductor memory device 900 may include first through kth semiconductor integrated circuit layers LA1 through LAk, in which the lowest first semiconductor integrated circuit layer LA1 is assumed to be an interface or control chip and the other semiconductor integrated circuit layers LA2 through LAk are assumed to be slave chips including core memory chips. The slave chips may form a plurality of memory ranks as described above.

The first through kth semiconductor integrated circuit layers LA1 through LAk may transmit and receive signals between the layers by through-substrate vias TSVs (e.g., through-silicon vias). The lowest first semiconductor integrated circuit layer LA1 as the interface or control chip may communicate with an external memory controller through a conductive structure formed on an external surface.

Each of the first semiconductor integrated circuit layer 910 through the kth semiconductor integrated circuit layer 920 may include memory regions 921 and peripheral circuits 922 for driving the memory regions 921. For example, the peripheral circuits 922 may include a row-driver for driving wordlines of a memory, a column-driver for driving bitlines of the memory, a data input-output circuit for controlling input-output of data, a command buffer for receiving a command from an outside source and buffering the command, and an address buffer for receiving an address from an outside source and buffering the address.

The first semiconductor integrated circuit layer 910 may further include a control circuit. The control circuit may control access to the memory region 921 based on a command and an address signal from a memory controller and may generate control signals for accessing the memory region 921.

Each of the semiconductor integrated circuit layers LA2 through LAk corresponding to the slave layer may include a compensation controller as described above. The compensation controller may perform the NBTI compensation operation and/or the PBTI compensation operation as described above.

FIG. 27 illustrates an example high bandwidth memory (HBM) organization.

Referring to FIG. 27, the HBM 1100 may have a stack of multiple DRAM semiconductor dies 1120, 1130, 1140, and 1150. The HBM of the stack structure may be optimized by a plurality of independent interfaces called channels. Each DRAM stack may support up to 8 channels in accordance with the HBM standards. FIG. 27 shows an example stack containing 4 DRAM semiconductor dies 1120, 1130, 1140, and 1150 and each DRAM semiconductor die supports two channels CHANNEL0 and CHANNEL1.

Each channel provides access to an independent set of DRAM banks. Requests from one channel may not access data attached to a different channel. Channels are independently clocked, and need not be synchronous.

The HBM 1100 may further include an interface die 1110 or a logic die at bottom of the stack structure to provide signal routing and other functions. Some function for the DRAM semiconductor dies 1120, 1130, 1140, and 1150 may be implemented in the interface die 1110.

Each of the DRAM semiconductor dies 1120, 1130, 1140, and 1150 may include a compensation controller as described above. The compensation controller may perform the NBTI compensation operation and/or the PBTI compensation operation as described above.

Figure 28:
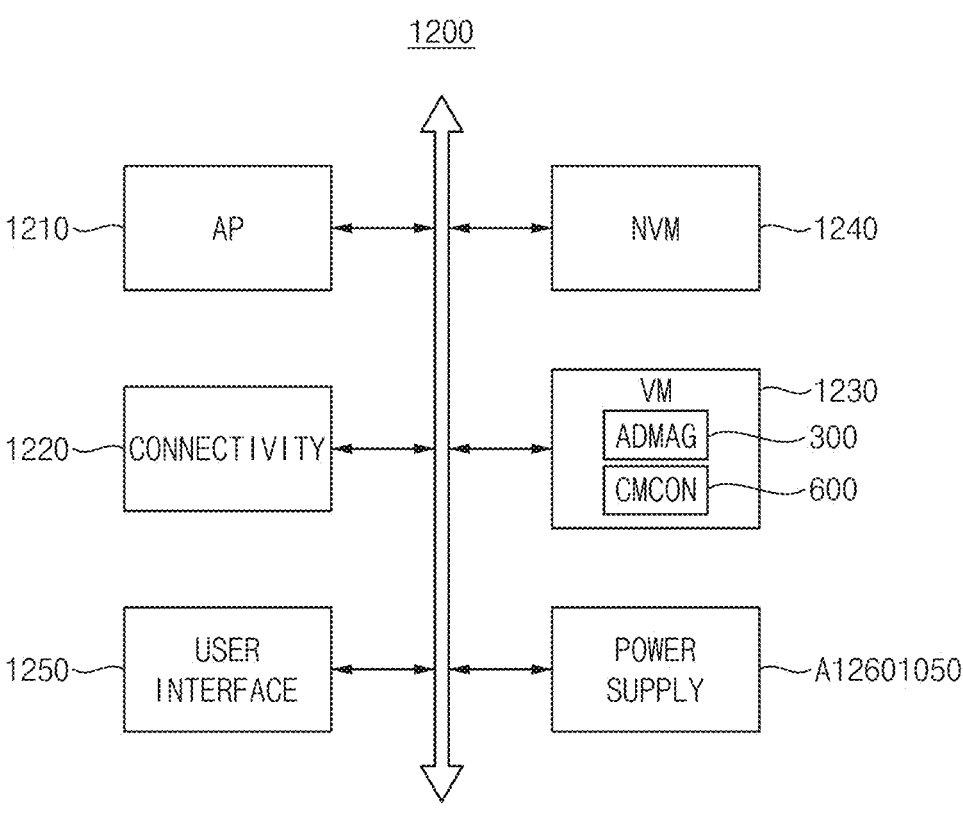
FIG. 28 is a block diagram illustrating a mobile system according to example embodiments.

FIG. 28 is a block diagram illustrating a mobile system according to example embodiments.

Referring to FIG. 28, a mobile system 1200 includes an application processor (AP) 1210, a connectivity device 1220, a volatile semiconductor memory device (VM) 1230, a nonvolatile semiconductor memory device (NVM) 1240, a user interface 1250, and a power supply 1260. In some embodiments, the mobile system 1200 may be, for example, a mobile phone, a smart phone, a personal digital assistant (PDA), a portable multimedia player (PMP), a digital camera, a music player, a portable game console, a navigation system, or another type of electronic device.

The application processor 1210 may execute applications, e.g., a web browser, a game application, a video player, etc. The connectivity device 1220 may perform wired or wireless communication with an external device. The volatile semiconductor memory device 1230 may store data processed by the application processor 1210 or may operate as a working memory. The nonvolatile semiconductor memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200.

As described above, the volatile semiconductor memory device 1230 may include an address manager (ADMNG) 300 and a compensation controller (CMCON) 600 as described above. As described above, the address manager 300 may provide the NBTI information and the PBTI information, and the compensation controller may perform the NBTI compensation operation and/or the PBTI compensation operation.

In one embodiment, the address manager 300 may be included in the memory controller of the application processor 1210, and the compensation controller 600 may be included in the semiconductor memory device 1230.

As described above, the semiconductor memory device and the method of operating the semiconductor memory device according to example embodiments may improve performance and reliability of the semiconductor memory device by efficiently managing the NBTI vulnerable cells and the PBTI vulnerable cells, and by efficiently compensating for variations in the threshold voltage.

Example embodiments may be applied to any electronic devices and systems. For example, the disclosure may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive driving system, etc.

The foregoing is illustrative of example embodiments and is not to be construed as limiting thereof. Although a few example embodiments have been described, those skilled in the art will readily appreciate that many modifications are possible in the example embodiments without materially departing from the present disclosure.

What is claimed is:

1. A semiconductor memory device comprising:
   a plurality of memory cells, each memory cell comprising a cell transistor comprising a gate electrode connected to a wordline corresponding to a row address, the cell transistor being configured to be switched based on a normal turn-on voltage and a normal turn-off voltage that are applied to the wordline during a normal operation;
   an address manager configured to provide negative bias temperature instability (NBTI) information and positive bias temperature instability (PBTI) information, the NBTI information including row addresses of NBTI vulnerable cells among the plurality of memory cells such that a decrease in a threshold voltage of the cell transistor due to application of the normal turn-off voltage about the NBTI vulnerable cells is greater than a reference decrease value, and the PBTI information including row addresses of PBTI vulnerable cells among the plurality of memory cells such that an increase in the threshold voltage of the cell transistor due to application of the normal turn-on voltage about the PBTI vulnerable cells is greater than a reference increase value; and a compensation controller configured to:
   increase the threshold voltage of the NBTI vulnerable cells by performing an NBTI compensation operation based on the NBTI information, and
   decrease the threshold voltage of the PBTI vulnerable cells by performing a PBTI compensation operation based on the PBTI information.

2. The semiconductor memory device of claim 1, wherein the compensation controller is further configured to apply, during the NBTI compensation operation, a compensation turn-on voltage higher than the normal turn-on voltage to wordlines corresponding to the row addresses of the NBTI vulnerable cells, based on the NBTI information.

3. The semiconductor memory device of claim 2, wherein the compensation controller is further configured to increase the compensation turn-on voltage as an operation temperature of the semiconductor memory device increases.

4. The semiconductor memory device of claim 1, wherein the compensation controller is further configured to apply, during the PBTI compensation operation, a compensation turn-off voltage lower than the normal turn-off voltage to wordlines corresponding to the row addresses of the PBTI vulnerable cells based on the PBTI information.

5. The semiconductor memory device of claim 4, wherein the compensation controller is further configured to decrease the compensation turn-off voltage as an operation temperature of the semiconductor memory device increases.

6. The semiconductor memory device of claim 1, wherein the compensation controller is further configured to perform the NBTI compensation operation and the PBTI compensation operation periodically based on a compensation period.

7. The semiconductor memory device of claim 6, wherein the compensation controller is further configured to decrease the compensation period as an operation temperature of the semiconductor memory device increases.

8. The semiconductor memory device of claim 1, wherein the address manager is further configured to store the NBTI information generated by a test operation of the semiconductor memory device.

9. The semiconductor memory device of claim 1, wherein the address manager is further configured to provide the PBTI information by monitoring access addresses for the normal operation comprising a read operation and a write operation about the plurality of memory cells during the normal operation.

10. The semiconductor memory device of claim 1, further comprising:
   a refresh controller configured to control a hammer refresh operation about a first row physically adjacent to a second row,
   wherein the second row corresponds to each of hammer addresses among a plurality of access addresses for the normal operation comprising a read operation and a write operation about the plurality of memory cells,
   wherein the hammer addresses are accessed more intensively than other access addresses among the plurality of access addresses, and
   wherein the address manager is configured to provide the hammer addresses as the PBTI information.

11. The semiconductor memory device of claim 1, wherein the cell transistor is a vertical channel transistor comprising a channel layer formed of indium gallium zinc oxide (IGZO).

12. The semiconductor memory device of claim 1, wherein the plurality of memory cells are grouped into a plurality of memory banks, and wherein the compensation controller is configured to independently perform the PBTI compensation operation and the NBTI compensation operation about each memory bank.

13. A semiconductor memory device comprising:
a plurality of memory cells, each memory cell comprising a cell transistor comprising a gate electrode connected to a wordline corresponding to a row address, the cell transistor being configured to be switched based on a normal turn-on voltage and a normal turn-off voltage applied to the wordline during a normal operation;
an address manager configured to provide negative bias temperature instability (NBTI) information and positive bias temperature instability (PBTI) information, the NBTI information including row addresses of NBTI vulnerable cells among the plurality of memory cells such that a decrease in a threshold voltage of the cell transistor due to application of the normal turn-off voltage about the NBTI vulnerable cells is greater than a reference decrease value, and the PBTI information including row addresses of PBTI vulnerable cells among the plurality of memory cells such that an increase in the threshold voltage of the cell transistor due to application of the normal turn-on voltage about the PBTI vulnerable cells is greater than a reference increase value among the memory cells; and
a compensation controller configured to:
increase the threshold voltage of the NBTI vulnerable cells by applying a compensation turn-on voltage higher than the normal turn-on voltage to wordlines corresponding to the row addresses of the NBTI vulnerable cells and by performing an NBTI compensation operation based on the NBTI information, and
decrease the threshold voltage of the PBTI vulnerable cells by applying a compensation turn-off voltage lower than the normal turn-off voltage to wordlines corresponding to the row addresses of the PBTI vulnerable cells and by performing a PBTI compensation operation based on the PBTI information.

14. A method of operating a semiconductor memory device comprising a plurality of memory cells, each memory cell comprising a cell transistor comprising a gate electrode connected to a wordline corresponding to a row address, the cell transistor being configured to be switched based on a normal turn-on voltage and a normal turn-off voltage applied to the wordline during a normal operation, the method comprising:
providing negative bias temperature instability (NBTI) information comprising row addresses of NBTI vulnerable cells among the plurality of memory cells such that a decrease in a threshold voltage of the cell transistor due to application of the normal turn-off voltage about the NBTI vulnerable cells is greater than a reference decrease value;
providing positive bias temperature instability (PBTI) information comprising row addresses of PBTI vulnerable cells among the plurality of memory cells such that an increase in the threshold voltage of the cell transistor due to application of the normal turn-on voltage about the PBTI vulnerable cells is greater than a reference increase value;

increase the threshold voltage of the NBTI vulnerable cells by performing an NBTI compensation operation based on the NBTI information; and
decrease the threshold voltage of the PBTI vulnerable cells by performing a PBTI compensation operation based on the PBTI information.

15. The method of claim 14, wherein the providing the NBTI information comprises:
applying a test turn-off voltage lower than the normal turn-off voltage to a wordline corresponding to a test row address;
performing a read operation about the wordline corresponding to the test row address; and
determining whether the test row address is a row address of NBTI vulnerable cells based on a result of the read operation.

16. The method of claim 15, further comprising:
determining memory cells corresponding to the test row address as defective memory cells when a decrease in the threshold voltage of the cell transistor due to application of the test turn-off voltage is greater than a first reference decrease value, and
determining the memory cells corresponding to the test row address as the NBTI vulnerable cells when the decrease in the threshold voltage of the cell transistor due to application of the test turn-off voltage is less than the first reference decrease value and is greater than a second reference decrease value.

17. The method of claim 14, wherein the providing the PBTI information comprises:
applying a test turn-on voltage higher than the normal turn-on voltage to a wordline corresponding to a test row address;
performing a read operation about the wordline corresponding to the test row address; and
determining whether the test row address is a row address of PBTI vulnerable cells based on a result of the read operation.

18. The method of claim 17, further comprising:
determining memory cells corresponding to the test row address as defective memory cells when an increase in the threshold voltage of the cell transistor due to application of the test turn-on voltage is greater than a first reference increase value, and
determining the memory cells corresponding to the test row address when the decrease in the threshold voltage of the cell transistor due to application of the test turn-on voltage is less than the first reference increase value and is greater than a second reference increase value.

19. The method of claim 14, wherein the performing the NBTI compensation operation comprises applying a compensation turn-on voltage higher than the normal turn-on voltage to wordlines corresponding to the row addresses of the NBTI vulnerable cells based on the NBTI information.

20. The method of claim 14, wherein the performing the PBTI compensation operation comprises applying a compensation turn-off voltage lower than the normal turn-off voltage to wordlines corresponding to the row addresses of the PBTI vulnerable cells based on the PBTI information.

* * * * *